(12) United States Patent
Mao

(10) Patent No.: US 9,344,042 B2
(45) Date of Patent: May 17, 2016

(54) HIGH EFFICIENCY POWER AMPLIFIERS WITH ADVANCED POWER SOLUTIONS

(71) Applicant: Hengchun Mao, Allen, TX (US)

(72) Inventor: Hengchun Mao, Allen, TX (US)

( * ) Notice: Subject to any disclaimer, the term of this patent is extended or adjusted under 35 U.S.C. 154(b) by 29 days.

(21) Appl. No.: 14/185,885

(22) Filed: Feb. 20, 2014

(65) Prior Publication Data

US 2014/0240052 A1  Aug. 28, 2014

Related U.S. Application Data

(60) Provisional application No. 61/850,972, filed on Feb. 27, 2013.

(51) Int. Cl.
| | |
|---|---|
| H03F 3/45 | (2006.01) |
| H03F 1/02 | (2006.01) |
| H03F 1/32 | (2006.01) |
| H03F 1/56 | (2006.01) |
| H03F 3/195 | (2006.01) |
| H03F 3/24 | (2006.01) |

(52) U.S. Cl.
CPC .............. *H03F 1/0222* (2013.01); *H03F 1/025* (2013.01); *H03F 1/32* (2013.01); *H03F 1/56* (2013.01); *H03F 3/195* (2013.01); *H03F 3/245* (2013.01); *H03F 2200/102* (2013.01); *H03F 2200/15* (2013.01); *H03F 2200/387* (2013.01); *H03F 2200/541* (2013.01)

(58) Field of Classification Search
CPC .......................................................... H03F 3/45
USPC ..................... 330/251, 207 A, 51, 207 P, 302
See application file for complete search history.

(56) References Cited

U.S. PATENT DOCUMENTS

| | | | |
|---|---|---|---|
| 6,031,746 A * | 2/2000 | Steigerwald et al. | 363/71 |
| 7,050,311 B2 * | 5/2006 | Lai | H02M 5/225 363/37 |
| 8,149,599 B2 * | 4/2012 | Coccia et al. | 363/21.02 |

* cited by examiner

*Primary Examiner* — Khanh V Nguyen
*Assistant Examiner* — Khiem Nguyen

(57) ABSTRACT

A device comprises a switch network having a plurality of switch cells connected in series, an output voltage at an output voltage port with an output capacitor, and an impedance network coupled between the switch network and an output voltage port with an output capacitor. Each switch cell has a plurality of input voltages and a plurality of switches, in which each switch is coupled to an input voltage, and a first input voltage coupled to a first switch has a different value from a second input voltage coupled to a second switch. The output voltage is configured to be a combination of the input voltages of the switch network in the form of: $V_o = \sum_1^N K_i \times V_i$, where Vo is the output voltage, N is the number of input voltages, Vi is the ith input voltage, and Ki is an integer equal to 0 or 1 depending on the ON/OFF status of the switches in the switch network.

14 Claims, 29 Drawing Sheets

HIGH EFFICIENCY POWER AMPLIFIERS WITH ADVANCED POWER SOLUTIONS

CROSS REFERENCE TO RELATED APPLICATIONS

This application is related to, and claims priority to U.S. Provisional Application No. 61/850,972, titled, "High Efficiency Power Amplifiers with Advanced Power Solutions" filed on Feb. 27, 2013, which is herein incorporated by reference.

TECHNICAL FIELD

The present invention relates to power conversion and power amplifiers, and, in particular embodiments, to high efficiency power topologies and control suitable for high efficiency power amplifiers and other demanding applications.

BACKGROUND

Power amplifiers are widely used in wireless communication systems and other electronic devices, especially in mobile devices. To achieve high system efficiency and/or longer battery life, it is very important to maintain high efficiency in power amplifiers.

The power amplifiers in many systems see signals with high peak to average power ratio. Because a typical power amplifier gets its energy from a power supply coupled to the drain (or the collector if a transistor is used) of its main power switch (a MOSFET or a transistor), its power efficiency can be improved by changing the drain voltage of its main power switch through changing the voltage of its drain power supply according to the envelope of the signal being processed by the power amplifier. When the signal envelope has high bandwidth as often seen in today's wireless systems, changing the voltage of drain power supply may cause the output signal of the power amplifier to be distorted.

Moreover, as the bandwidth of the signal increases, the power supply's control bandwidth should be increased accordingly. This put very high burden into the power supply, and the efficiency of the power supply is low with existing technology.

Improvements are needed to reduce the signal distortion in a power amplifier with variable drain voltage, and to increase the efficiency of the drain power supply.

SUMMARY OF THE INVENTION

These and other problems are generally solved or circumvented, and technical advantages are generally achieved, by preferred embodiments of the present invention which provides an improved resonant power conversion.

According to one embodiment of this disclosure, a device comprises a switch network having a plurality of switch cells connected in series, an output voltage at an output voltage port with an output capacitor, and an impedance network coupled between the switch network and an output voltage port with an output capacitor. Each switch cell has a plurality of input voltages and a plurality of switches, in which each switch is coupled to an input voltage, and a first input voltage coupled to a first switch has a different value from a second input voltage coupled to a second switch. The output voltage is configured to be a combination of the input voltages of the switch network in the form of: $Vo = \sum_{1}^{N} Ki \times Vi$, where Vo is the output voltage. N is the number of input voltages, Vi is the ith input voltage, and Ki is an integer equal to 0 or 1 depending on the ON/OFF status of the switches in the switch network.

According to another embodiment of this disclosure, a system comprises an upper cell having N1 input voltages and 2×N1 switches and capable of producing $2^{N1}$ output voltage levels (N1 is a positive integer), a lower cell having N2 input voltages and 2×N2 switches and capable of producing $2^{N2}$ output voltage levels (N2 is a positive integer), and a control circuit controlling the gate drive amplitude of a switch in the lower cell to operate the lower cell in linear mode during an output voltage level transient. An input voltage in the lower cell has a lower value than an input voltage in the upper cell.

According to yet another embodiment of this disclosure, a method comprises configuring an input voltage pair with two input voltages V1 and V2 in series, where V1 has a different value from V2, configuring a switch network with a 4-switch cell arranged in two pairs in which each pair has two switches in a totem pole configuration and is coupled to an input voltage, and with an output terminal coupled to it, and controlling the switch network such that an output voltage at the output port has 4 different values: 0, V1, V2, and V1+V2.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely in power amplifiers and power supply technologies for power amplifiers. The invention may also be applied, however, to a variety of other electronics systems, including integrated circuits, CPUs (central processing units), computers, telecom equipments, any combinations thereof and/or the like. Hereinafter, various embodiments will be explained in detail with reference to the accompanying drawings.

Figure 1:
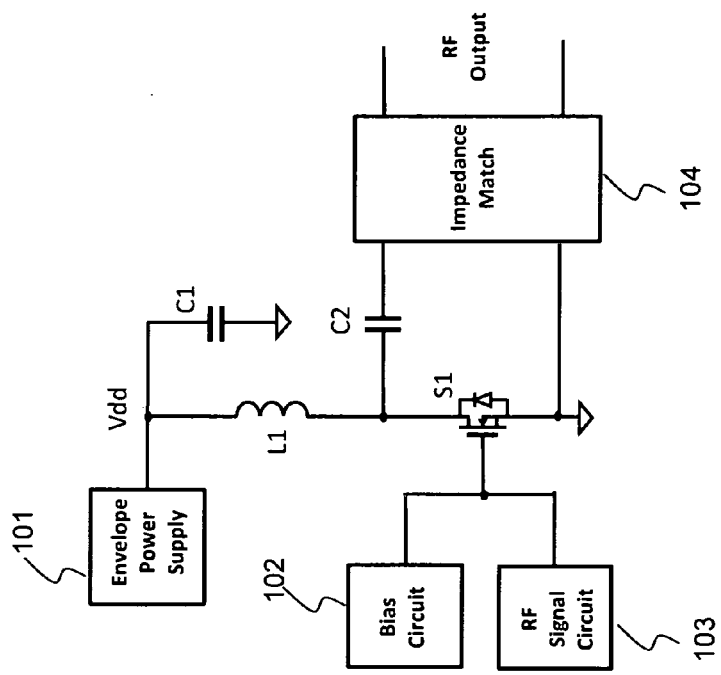
FIG. 1 illustrates a schematic diagram of a power amplifier.

Often a power amplifier is required to process a signal with a variable amplitude envelope which is related to the information to be communicated. The envelope may have high-frequency components up to several tens or even hundreds of MHz in radio frequency (RF) communication systems and devices and other equipment. The carrier frequency is usually much higher than the highest component frequency of the envelope. In the last few decades, people have tried to develop high efficiency technologies, such as envelope tracking (ET) and envelope elimination and restoration (EER), for power amplifiers intended for variable envelope applications. FIG. 1 shows a block diagram for such a high efficiency amplifier. S1 is the main switch. Although a MOSFET is shown as an example, it can also be a bipolar transistor (BJT) or other switching devices. L1 is the RF choke, C2 is the DC blocking capacitor to prevent dc component from getting into the RF output. C1 is the bypass capacitor to filter out noise in the power path. The envelop power supply 101 provides drain power to the switch, and is designed to follow the envelope information of the signal to be amplified. The bias circuit sets up the switch's operating point, and RF signal circuit conditions the signal to be amplified and couples it to the switch. The impedance match circuit 104 matches the impedance of S1 with the impedance of the RF load connected to the power amplifier.

With EER technology (such as in polar modulation), S1 works in switching mode (such as in Class E mode). The envelope power supply's output Vdd is basically a replica of the envelope of the RF signal, and the RF signal circuit for the gate (or base if a BJT is used) in the power amplifier just processes the phase information of the RF input. If the timing of the envelop signal is aligned perfectly with the phase signal, the RF output can have the right envelope and phase information. Because in the switching mode the switch S1 works in two low loss states: saturation (ON) or block (OFF), the EER technique theoretically has high power efficiency. However, it is extremely difficult to achieve a good phase and envelope alignment, and it's very challenging to implement a fast envelope power supply, so it's very expensive and difficult to implement EER technology in practice.

With ET technology, S1 works in linear mode (such as in Class A, Class AB or Class B mode). Vdd tracks but is slightly higher than the amplitude of RF output signal, and the gate signal is the same as in a normal linear amplifier (i.e. has both amplitude and phase information). With ET technology, the transistor's power loss is greatly reduced compared to that in a normal linear power amplifier due to the reduced voltage applied to the transistor. As a result, the ET power amplifier also achieves high power efficiency. ET is a very promising technology for high efficiency linear power amplifiers, but similar to the limitations of EER technology mentioned above, ET technology also faces tremendous challenges:

The envelope power supply has to provide power with very wide frequency spectrum. For example, in LTE technologies, the RF signal spectrum may have a bandwidth up to 20 MHz, but the envelope signal spectrum may have an effective bandwidth up to 100 MHz. The state of art power technology cannot process such wide-bandwidth power effectively;

The fast changing envelope power applied to the drain path of an ET power amplifier causes significant RF signal distortion, and thus tremendous predistortion needs to be used to regain the linearity of the amplification. Such predistortion normally requires a large amount of calibration work and complex procedure, and thus significantly increases the implementation cost.

The current ET technology doesn't consider the internal dynamics of a power amplifier to the drain power, and thus cannot be optimized for efficiency improvement reliably.

In this disclosure, new technologies addressing the above issues will be proposed and discussed in details. Although the description is made in the context of ET technology, the principles can also be applied to EER technology and polar modulation, as they also involve interaction between the fast envelope power supply and the power amplifier it powers, and the need of very fast dynamic power supplies.

Figure 2:
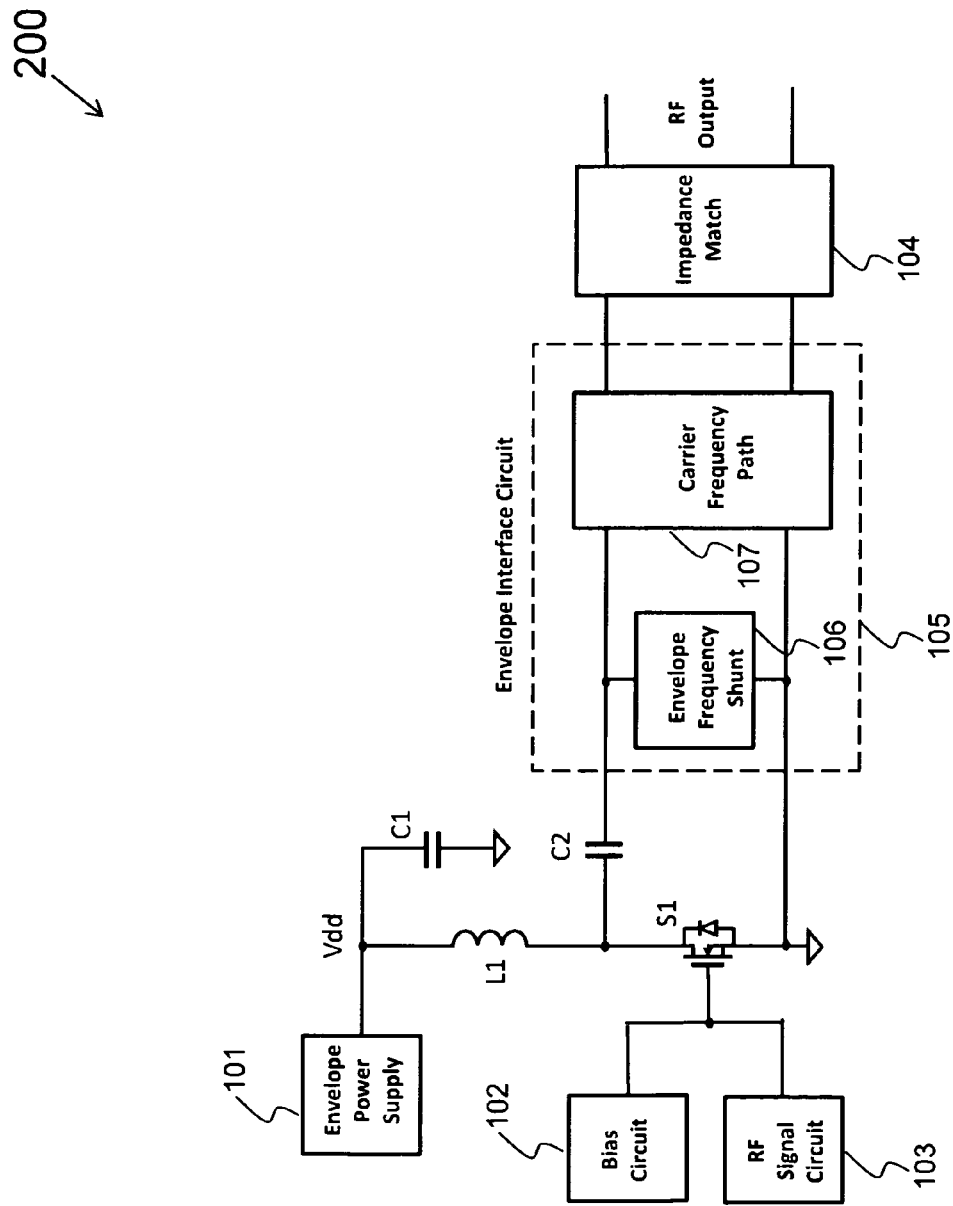
FIG. 2 illustrates a schematic diagram of a first illustrative embodiment of a power amplifier in accordance with various embodiments of the present disclosure.

FIG. 2 shows a simplified block diagram of a new ET+ technology. Although a single transistor Class A power amplifier is shown, similar technologies can be applied to other power amplifier topologies, such as Class AB, Class B, Push-pull, Class E, Class F etc. Compared to the topology in FIG. 1, the ET+ topology has an envelope interface circuit 105 between the power switch and the optional impedance matching circuit 104. In an embodiment in accordance with the present invention, the envelope interface circuit 101 can be part of the impedance matching circuit 104. As well known in the industry, harmonic termination function can be also part of the impedance matching circuit. The envelope interface circuit consists of an envelope frequency shunt 106 and a carrier frequency path circuit 107. The circuit 106 presents a low impedance path to the envelope signal, thus allowing the envelope current to flow through it and return to the envelope power supply 101 with little impact to the output RF signal. The circuit 106 presents a high frequency to the carrier frequency, and thus doesn't impact RF signal amplification significantly. On the contrary, the carrier frequency path circuit 107 presents a high impedance path to the envelope signal, forcing the envelope signal to go through circuit 106. To carrier frequency signal, the circuit 107 presents a low impedance path, allowing the RF output signal to pass through it without much distortion or attenuation. With this architecture, clear envelope signal path (with relatively lower frequency contents) and carrier frequency path (with relatively higher frequency contents) are established. As a result, the variable amplitude power applied to the drain path of the power switch may not cause significant distortion to the RF output, significantly reducing the requirements of predistortion and its associated costs. This concept can be easily extended to other power amplifier architectures, such as EER and polar modulation.

Figure 3:
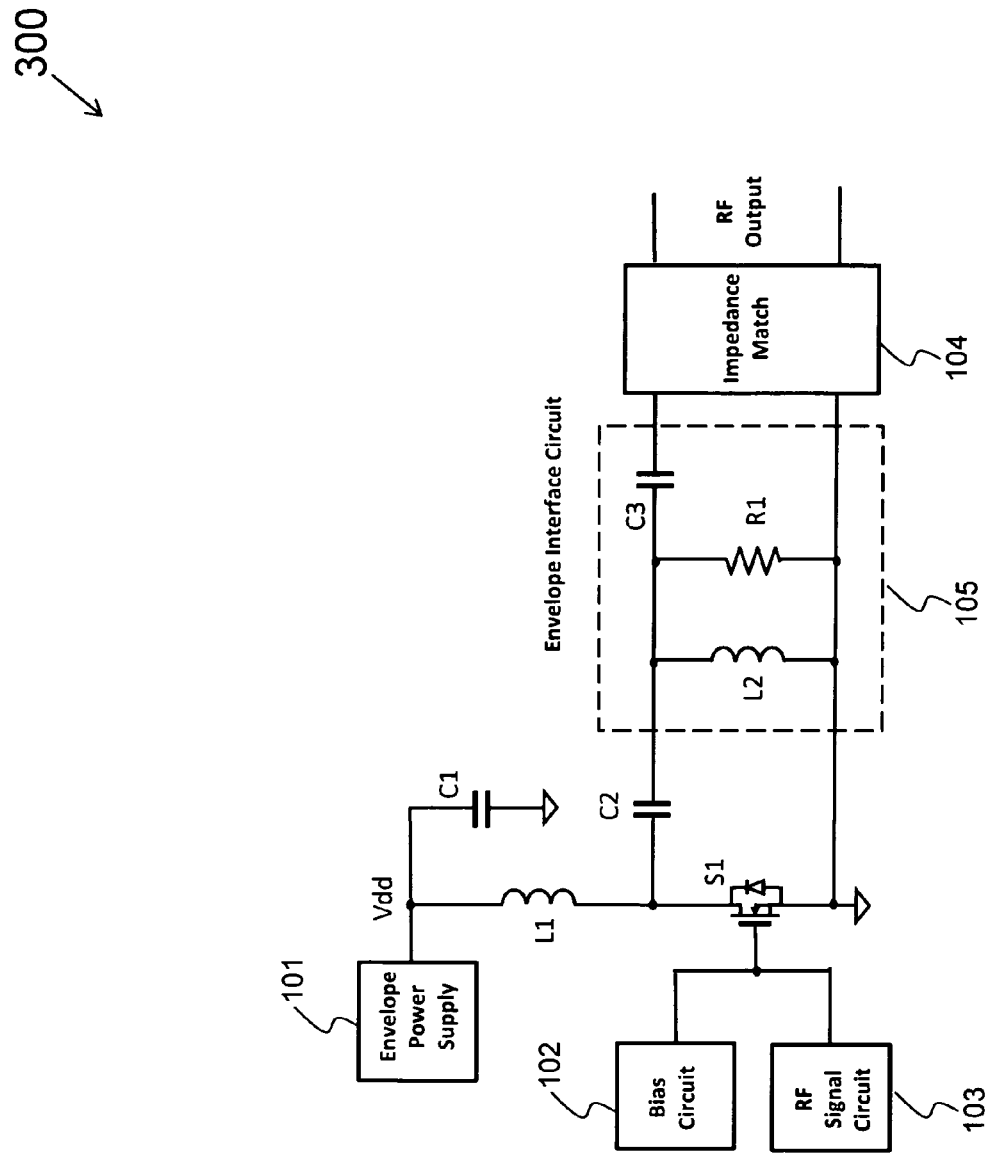
FIG. 3 illustrates a detailed schematic diagram of an embodiment of a power converter in accordance with various embodiments of the present disclosure.

FIG. 3 shows a more detailed block diagram of the ET+ technology. The envelope interface circuit 106 is implemented with simple circuits. In one embodiment, the envelope frequency shunt circuit 106 is implemented as an inductor L2 and an optional resistor R1. R1 also damps possible resonance between reactive components, and so improves the signal quality in the amplifier. Moreover, R1 allows the drain voltage to change relatively quickly with the change of the bias current or bias voltage to the switch S1 when needed, and thus improves the envelope controllability of the architecture.

Figure 4:
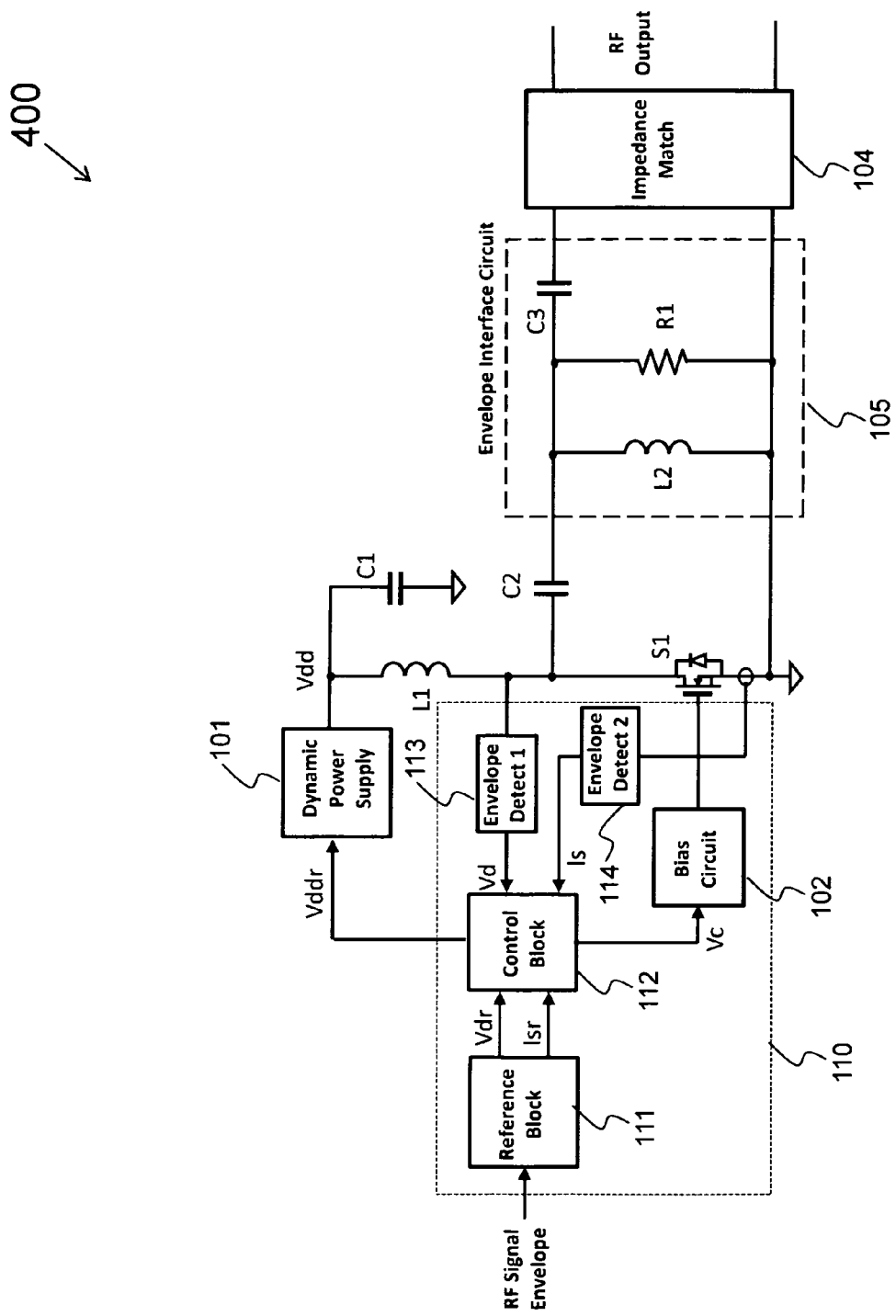
FIG. 4 illustrates a schematic diagram of an embodiment of a power amplifier in accordance with various embodiments of the present disclosure.
Figure 5:
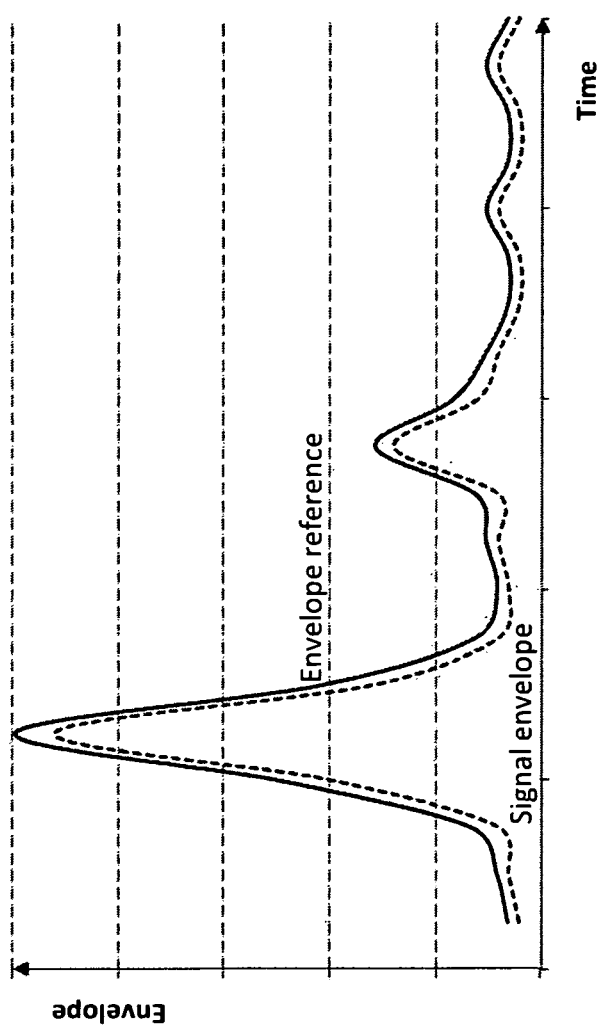
FIG. 5 illustrates an embodiment of an envelope reference in accordance with various embodiments of the present disclosure.

One of the key aspects to achieve high performance and high efficiency in power amplifiers is to operate the switch at the right operating point. As a minimum requirement, the valleys (the lowest points of the waveform) of the drain voltage should be just slightly higher than zero at any point of time, and the valleys of the source current should be just slightly higher than zero under all conditions too. This requires the switch be biased according to the envelope of the RF input (or output) signal. As the envelope bandwidth increases over time for higher rates of information transfer, the drain voltage envelope of the switch (Vd) can have significant deviation from the power source voltage Vdd due to the complex dynamics of the power amplifier. As the envelope bandwidth is much lower than the carrier frequency, the envelope dynamics in FIGS. 3 and 4 is determined mainly by L1, C2, L2 and R1, and also depends on the characteristics of the power switch S1. Proper control is needed to ensure the operating point of S1 to follow the signal envelope properly. In FIG. 4, an envelope reference block 111 converts the RF signal amplitude at input or output of the power amplifier to envelope reference signals Vdr for the drain voltage and Idr for the source current of S1. The reference is based on the signal envelope, and a buffer signal is added to the signal envelope to make sure that the envelope reference is higher than the required signal envelope by a certain margin, as is exemplified by FIG. 5. The buffer value can be fixed or adjusted according to actual operation so that the performance can be optimized. Also, the reference signals may not have the exact replica of the envelope signal, and some of the highest frequency components in the envelope signal may be reduced or removed from the reference signals to reduce implementation complexity and cost. An envelope detect circuit 113 is coupled to the drain of S1, so its voltage envelope Vd is sensed and used as a feedback signal. Similarly, the source current of S1 is sensed and coupled to an envelope detect circuit 114 to generate the envelope signal Is of the source current. A control block 112 may consist of feed-forward function, feedback function and any combination thereof. The block 112 processes the reference signals Vdr, Isr and feedback signals Vd and Is, to generate the drain power reference Vddr, and bias control reference Vc. The dynamic power supply 101 generates a drain power Vdd according to Vddr, while the bias control circuit 102 uses Isr as the reference to control the bias of S1. The RF signal conditioning and control, which may involve functions such as amplification, delay, filtering, alignment etc are performed by the RF signal circuit and are not discussed in details here, as they do not directly contribute to the envelope control. Although voltage signals are used to describe the envelope signal Vd, Is and their references, some or all of these signals can also be current signals.

Figure 6:
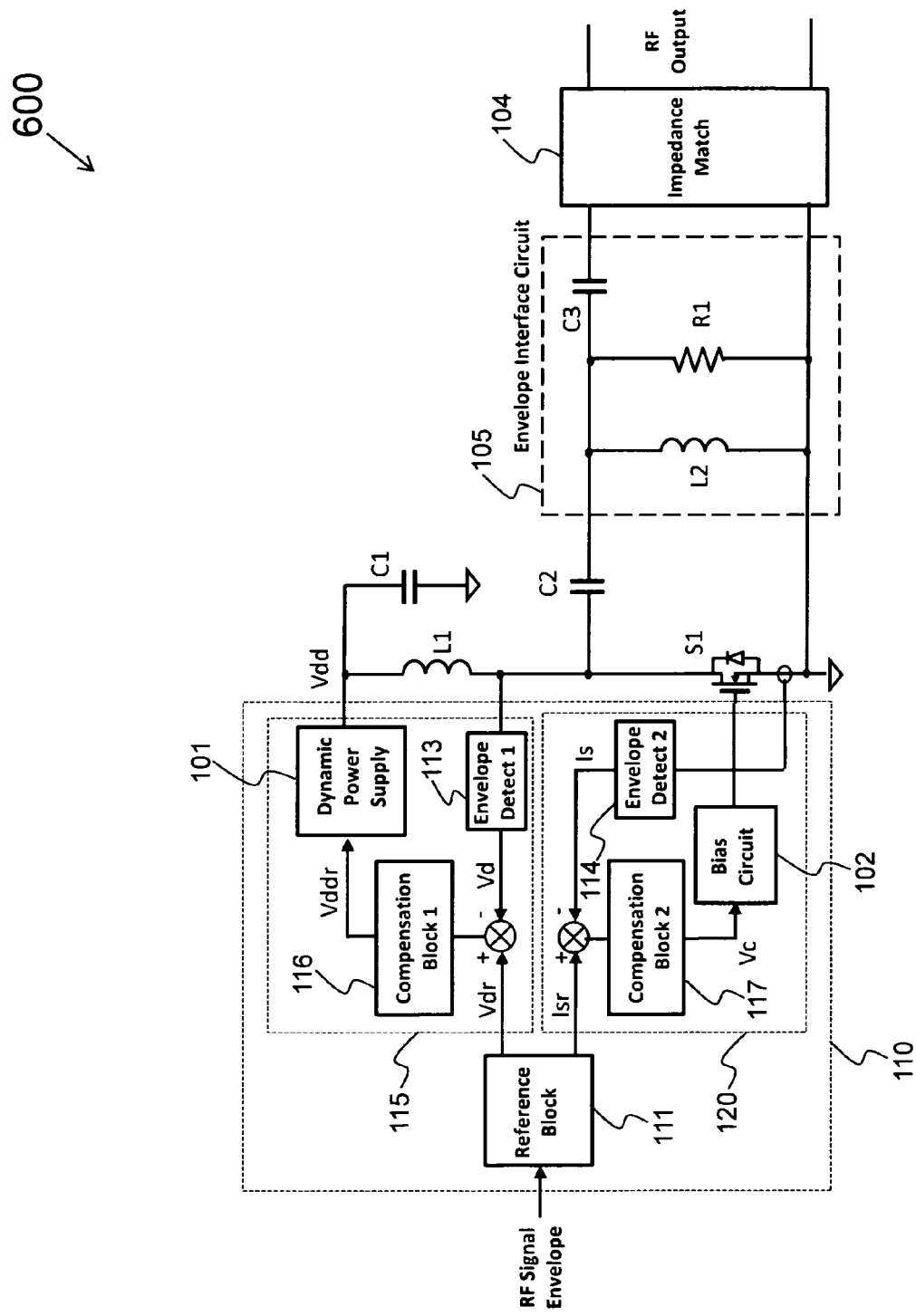
FIG. 6 illustrates an embodiment of a power amplifier in accordance with various embodiments of the present disclosure.
Figure 7:
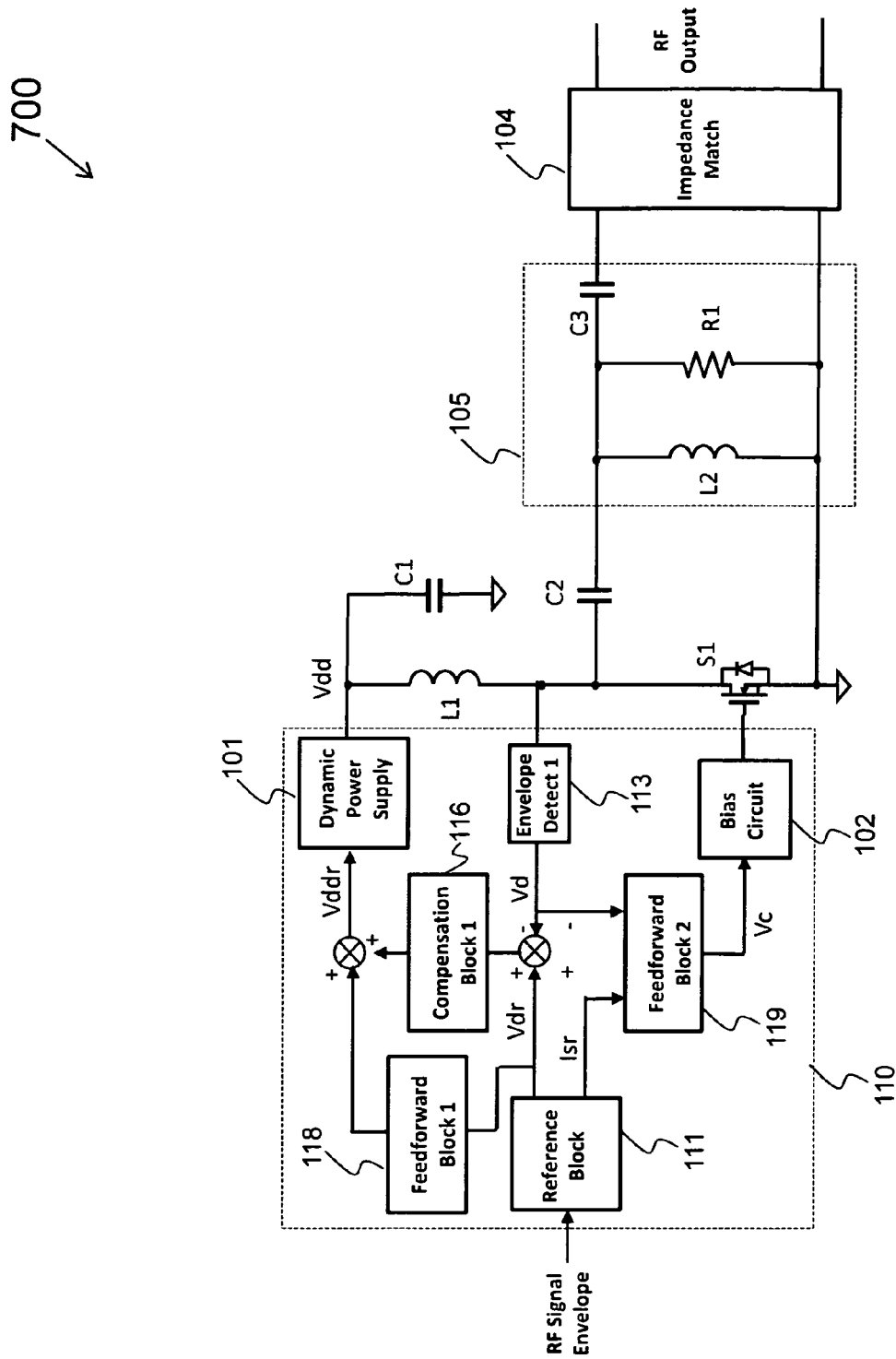
FIG. 7 illustrates an embodiment of a power amplifier with various embodiments of the present disclosure.

The control architecture in FIG. 4 can have many different implementations. FIG. 6 shows a preferred embodiment, in which both the drain voltage envelope and source current envelope are controlled through feedback control. A difference block generates the drain voltage envelope error signal by comparing the reference signal Vdr and the envelope feedback signal Vd. Then the error signal is processed by compensation block 115 to generate the drain power reference Vddr. Another difference block generates the source current envelope error signal by comparing the reference signal Isr and the envelope feedback signal Is. Then this error signal is processed by compensation block 117 to generate the bias control voltage Vc. FIG. 7 shows another preferred embodiment in which both feedback control and feed-forward control are used to accomplish the envelope control function. In accordance with this embodiment, a feed-forward control block 118 is used to process the reference signal Vdr. Such feed-forward function can consider known effects of the power amplifier dynamics. However, due to parameter variations and other deviation from ideal condition, it may not be practical and economical to rely on the feed-forward control alone for the drain voltage envelope control. Therefore, a feedback control block 116 similar to the one in FIG. 6 is also included to fine tune the control action for the drain voltage. The outputs of the block 118 and the block 116 are summed together to adjust the output of the dynamic power supply 101. Because of the added feed-forward control, the operating range and requirements of the feedback control in FIG. 7 can be lower than that in FIG. 6. Since the low-frequency dynamics between the source current and gate voltage of a switch is usually simpler than the relationship between the drain voltage and power input, it's possible to use just feed-forward control for the source current envelope control, as is shown in FIG. 7 (through feedforward block 119). However, if the effect of the drain voltage on the gate voltage (the Miller effect) is to be considered, an optional link can be established by sending the drain envelope signal Vd into the feed-forward block for the source current control, so proper measures can be taken to reduce or eliminate the miller effect in the source current.

Figure 8:
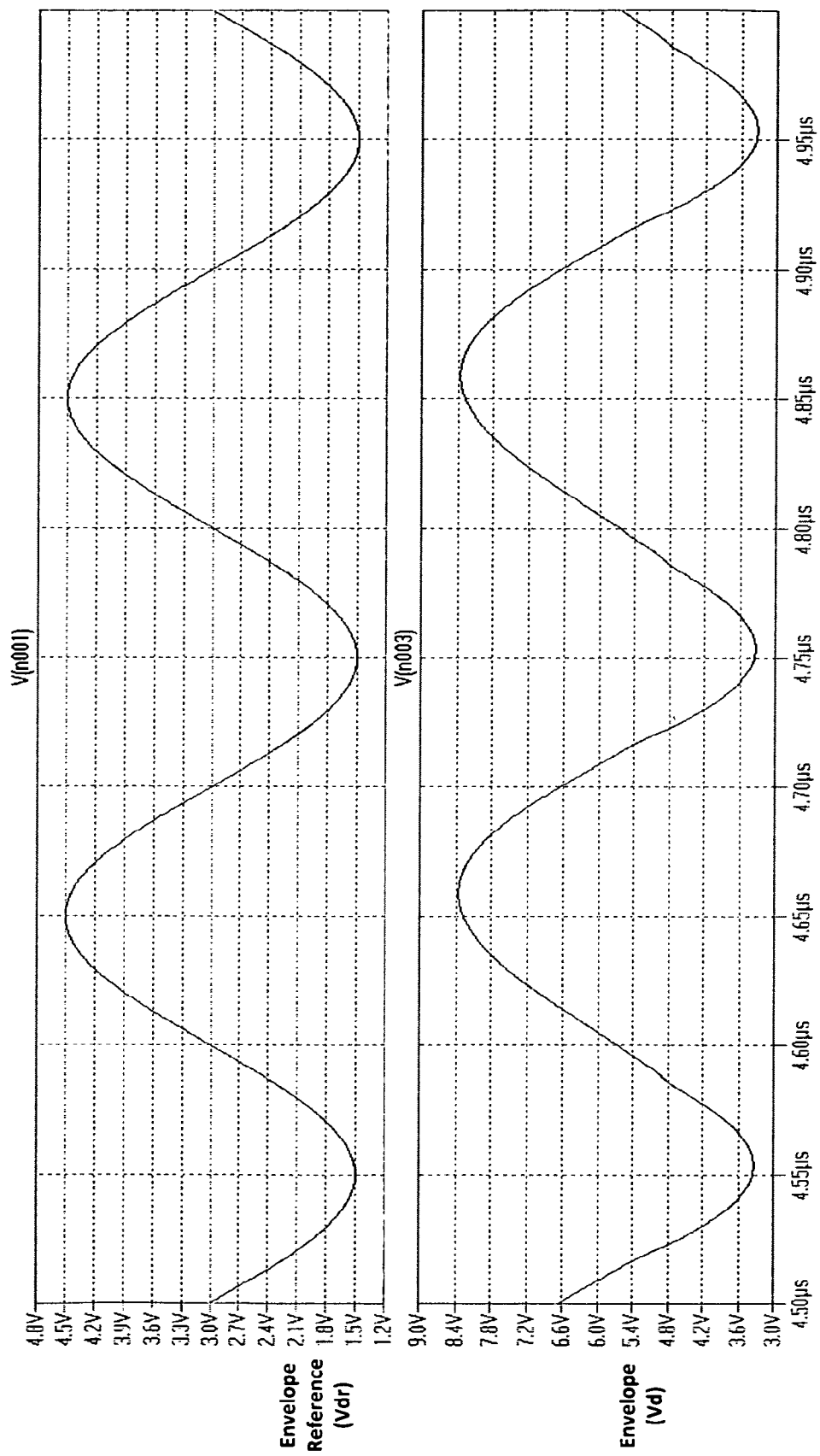
FIG. 8 illustrates simulated waveforms of a power amplifier in accordance with various embodiments of the present disclosure.

FIG. 8 shows simulated waveforms of a drain voltage envelope and its reference in an embodiment. Clearly, with proper design the drain voltage envelope can be controlled to follow its reference closely.

A key aspect of the above implementation is to implement a high-efficiency dynamic power supply with very wide bandwidth. Generally, to achieve a high efficiency power conversion, a switching power converter is preferred over a linear power supply. However, a state of art switching power converter may not be able to have wide enough bandwidth. Some people proposed to use a combination of switching power converter and a linear power supply in a series or parallel configuration. Such combination naturally has relatively low efficiency and high control complexity. Another proposed method is to use a multi-output power supply followed by a voltage selection circuit, and the voltage selection circuit selects one of the voltages as the output of the dynamic power supply. However, to achieve a good result, the number of the voltages should be high, thus resulting in high implementation cost.

Figure 9:
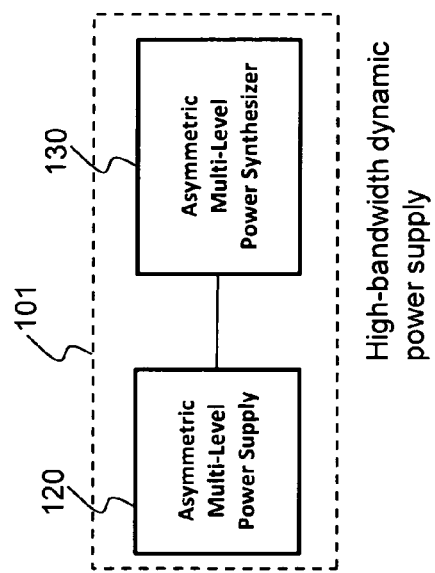
FIG. 9 illustrates an embodiment of a power supply architecture in accordance with various embodiments of the present disclosure.

A new power architecture is shown in FIG. 9 for fast dynamic power supplies. A multi-output power supply 120 with a limited number of different output voltage levels are followed by an asymmetric multi-level power synthesizer 130. The power synthesizer 130 adds its input voltages in different ways so that its output voltage has a much higher number of voltage levels than its number of input voltages.

Figure 10:
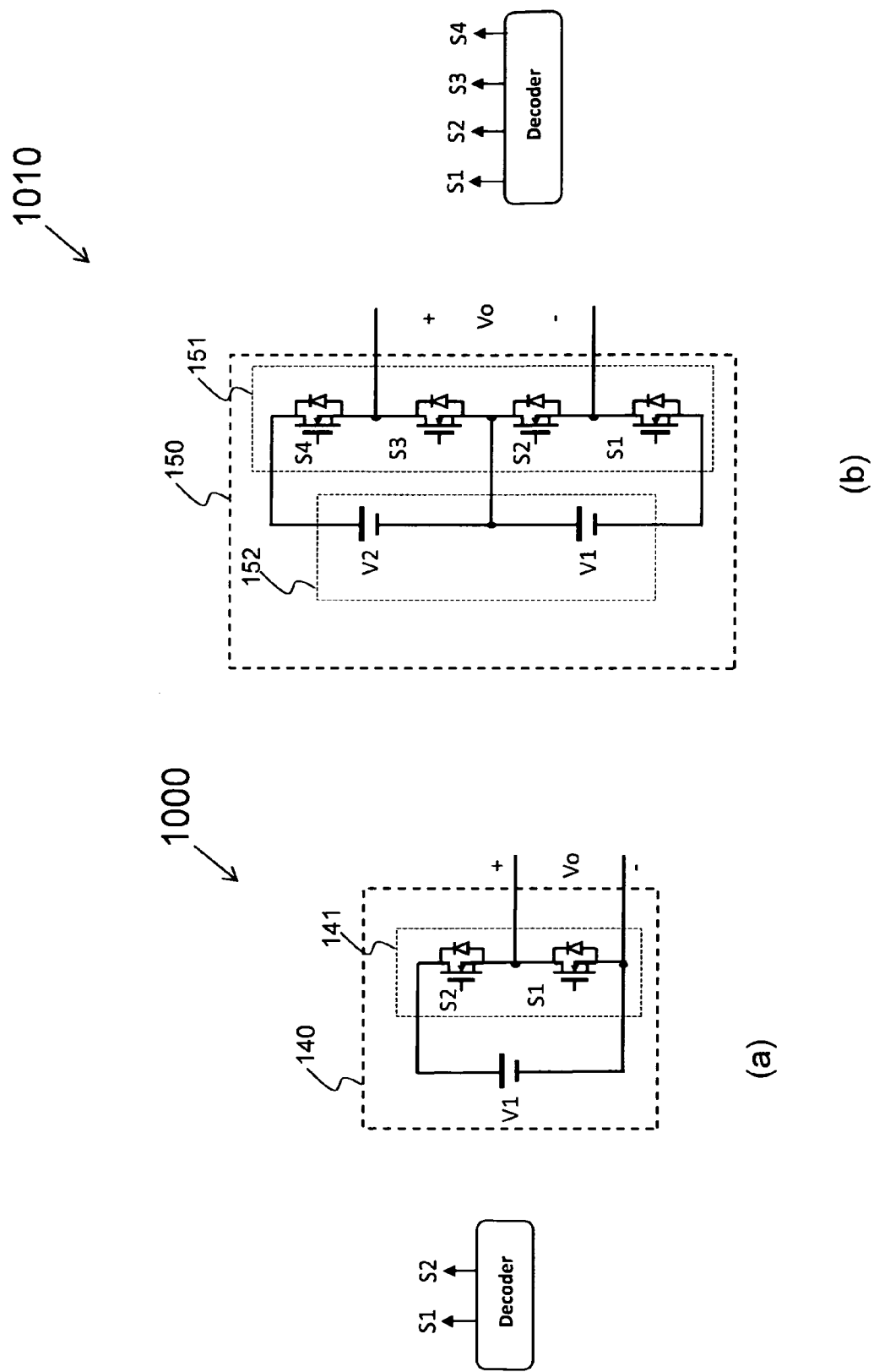
FIG. 10 illustrates embodiments of basic cells of an asymmetric multi-level power synthesizer in accordance with various embodiments of the present disclosure.

FIG. 10 shows the basic cells of an asymmetric multi-level synthesizer. FIG. 10(*a*) is a two-level cell. Its output is zero when S1 is ON, and V1 when S2 is ON. S1 and S2 are controlled to be in complementary mode with a short transition between states in which both switches are off to avoid cross conduction. FIG. 10(*b*) shows a four-level cell, with an asymmetric input voltage pair 152, and a four-switch network 151 consisting of a switch pair S1 and S2 in a totem pole configuration, and a second switch pair S3 and S4 in another totem pole configuration. An output terminal is coupled to the common node of each totem pole (i.e. at the junction of the top switch and the bottom switch in the pair). Two voltage sources at the input can have a substantially doubling relationship as described above: V2=2*V1. There are 4 possible states:

S1 and S4 OFF, S2 and S3 ON: Vo=0;
S1 and S3 ON, S2 and S4 OFF: Vo=V1;
S2 and S4 ON, S1 and S3 OFF: Vo=V2=2V1;
S1 and S4 ON, S2 and S3 OFF: Vo=V1+V2=3V1

Again, the S1 and S2 switch pair, as well as the S3 and S4 switch pair, are controlled to be in complementary mode so at most one switch conducts in a pair at any time. There is a short transition period if the switches in a pair need to change states during which both switches are off to avoid cross conduction. With this structure, if the input voltages of synthesizer have a doubling relationship between them (such as V2=2*V1, V3=2*V2 and so on), the synthesizer basically becomes a binary encoder of voltages (power), and the levels of the output voltage have even step size between them. For example, if the multiple-output power supply's output includes 1V and 2V, then the output of the synthesizer can be 0V, 1V, 2V, and 3V. Generally, n voltages at the input of the synthesizer can be synthesized into $2^N$ different voltage levels at the output using 2N switches. However, in other embodiments the input voltages may not follow the doubling relationship precisely and the step size between adjacent voltage levels does not have to be the same in the whole range. Generally, it is desired that the doubling relationship substantially to achieve good performance. For example, the higher voltage in a four-level cell should be maintained within a range of 1.5 to 2.5 times the lower voltage. Although the doubling relationship will be used in the following description, the principles of power conversion, power synthesizer and control can be easily modified for other voltage relationships.

Figure 11A:
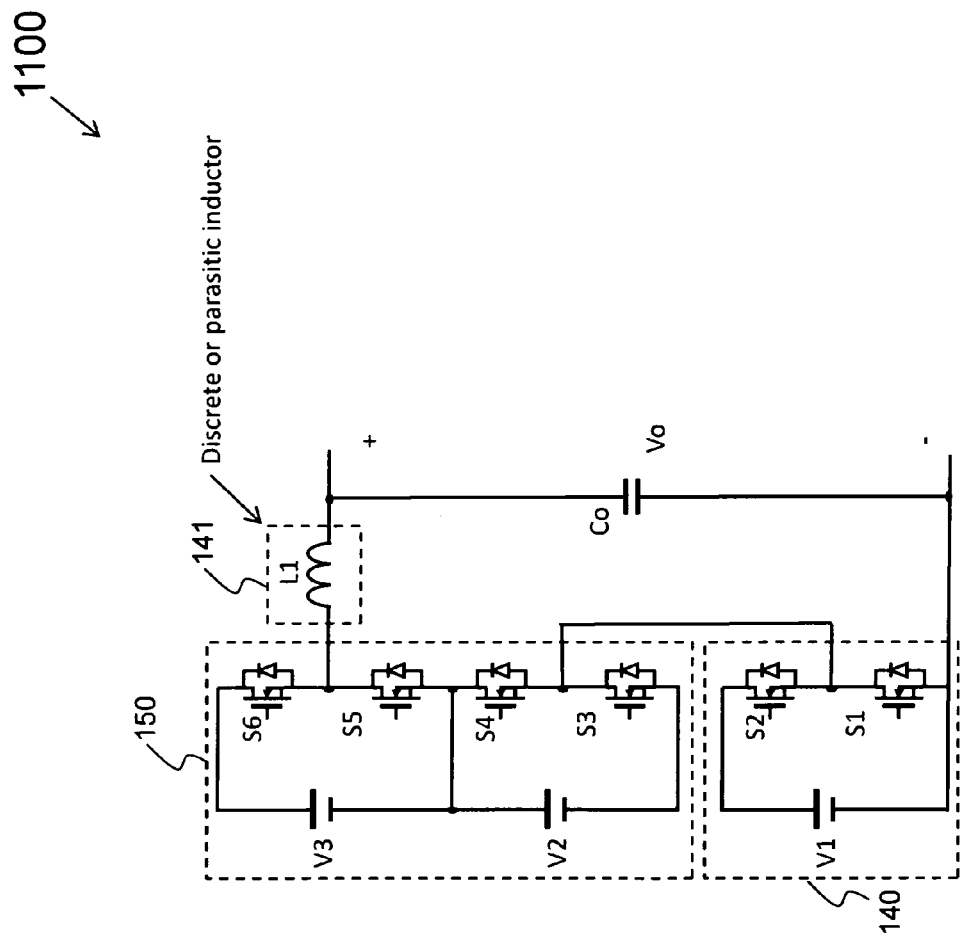
FIGS. 11(a) and 11(b) illustrate embodiments of an asymmetric multi-level power synthesizer in accordance with various embodiments of the present disclosure.
Figure 11B:
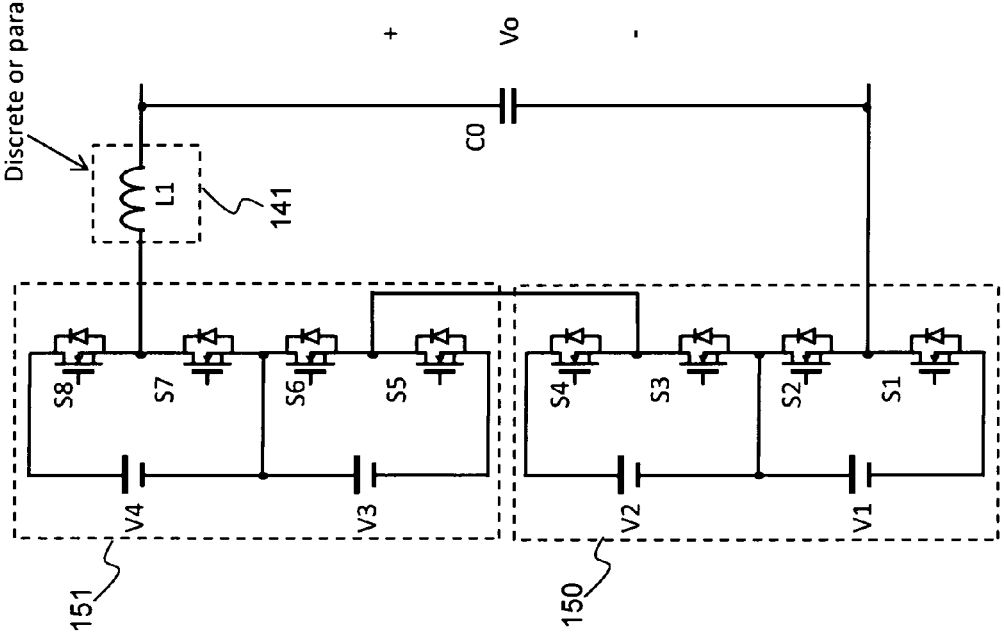

Any number of two-level cells and four-level cells can be connected in series by putting their output voltages in series to get a higher number of voltage levels. For example, a configuration with a two-level cell in series with a four-level cell makes an 8-level synthesizer, and a configuration with a four-level cell directly in series with another four-level cell makes a 16-level synthesizer. Note that the input voltages of the adjacent cells should also follow a voltage doubling relationship, i.e. the lower input voltage in the cell with higher voltages should be twice the higher input voltage in the cell with lower voltages. More voltage levels can be obtained by putting more cells in series, as this structure is easily expandable. Generally, a switch network with a N1-switch cell and a N2-switch cell is capable of producing N1 times N2 voltage levels. When one more cell with N3 switches is added, the number of voltage levels the switch network can produce is increased to N3 times the original number of voltage levels. Also, if a switch network has N input voltages, it is capable of producing $2^N$ voltage levels using 2N switches. FIG. 11(*a*) shows examples of an 8-level synthesizer, and FIG. 11(*b*) shows a 16-level synthesizer. The impedance network 141 is coupled between the switch networks and the output and reduces the current flowing through the switches during the switching transition between different states, and thus increases the efficiency. The impedance network has naturally filtering function working together with the output capacitor Co. In one preferred embodiment, the impedance network is an inductor, names as L1. L1 and the output capacitor Co may become part of a resonant tank. The value of L1 should not be too high to avoid significant voltage oscillation at the output. In a preferred embodiment, the characteristic impedance $$Zo = \sqrt{\frac{L1}{Co}} \approx Rs,$$

where Rs is the resistance in the current path inside the power synthesizer, including the switch resistances, connection resistance, and resistance of L1. This means the resonant tank consisting of L1 and C1, as well as Rs has a quality factor (defined as Zo/Rs) of substantially close to 1, for example in the range of 0.4 to 2.5. L1 can be a discrete inductor, or the parasitic inductance in the current path of the power synthesizer including the package inductances of the switches, and any combination thereof. In a preferred embodiment, Co can be placed at or inside the power amplifier the synthesizer powers. If the synthesizer and the power amplifier are in different dies or different packages, the parasitic inductance from the packages and interconnection between them may be enough to serve the purpose of L1.

As explained above, an asymmetric power synthesizer behaves like a power encoder. The drive signals for the switches in a power synthesizer can be obtained from a decoding process of the digital representative of the desired voltage. If the desired voltage is not in a digital format originally, an ADC converter can be used to digitize the required value. This control scheme is especially suitable for digital implementation.

Figure 12:
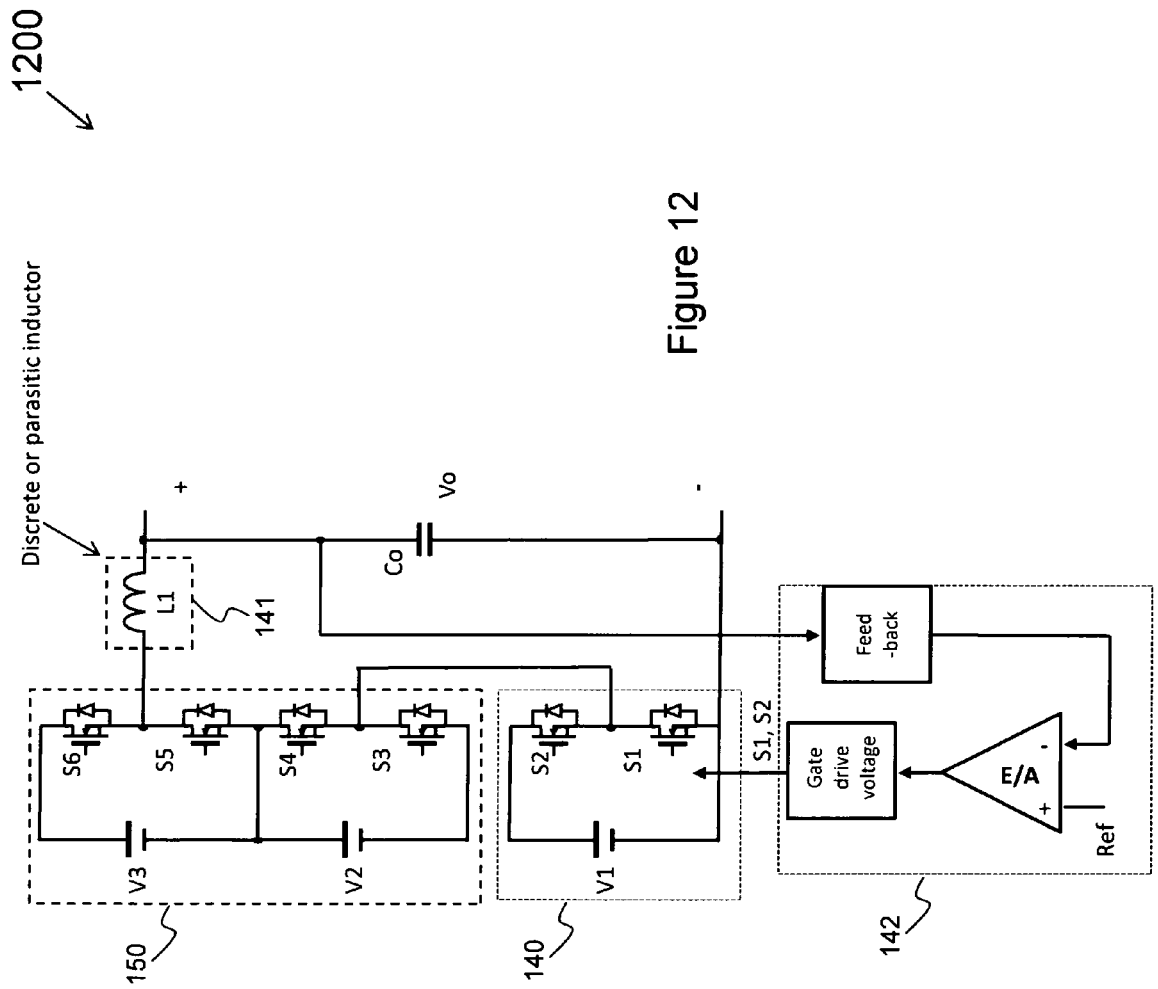
FIG. 12 illustrates an embodiment of a multi-level power synthesizer with linear control in accordance with various embodiments of the present disclosure.

The output voltage of a power synthesizer as described above has discrete values as it changes from one level to another level rapidly. Sometimes it's desirable to have a smoother and more accurate output. A linear regulator can be added at the output to achieve the smoothing function during a level change and/or to realize accurate voltage control. This linear regulation can also be implemented by controlling the gate drive voltage amplitude of switches within the synthesizer. FIG. 12 shows an example, with a four-level symmetric cell 150 and another four-level cell 151, and an impedance cell 141, and output voltage C0. Again, the impedance network 141 reduces the current flowing through the switches during the switching transition between different states, and thus increases the efficiency. The impedance network has naturally filtering function working together with the output capacitor Co. In one preferred embodiment, the impedance network is an inductor, names as L1. L1 and the output capacitor Co may become part of a resonant tank. A control circuit 142 is used to adjust the amplitude of the driving voltage of S1 and S2. The timing of S1 and S2's gate drive is still controlled by the decoder discussed above, and other switches are still controlled by the decoder. The linear control of S1's and S2's drive voltage changes the resistance of this switch pair, and thus can achieve fine-tune regulation of the output voltage of the power synthesizer. This linear control can also be used to reduce the output oscillation if needed. Obviously, the range of the linear adjustment of the output voltage can be less than 1 step size of the voltage levels, and thus high efficiency can still be achieved. This is a simple and low cost implementation of accurate and fast dynamic control in dynamic power supplies.

Figure 13:
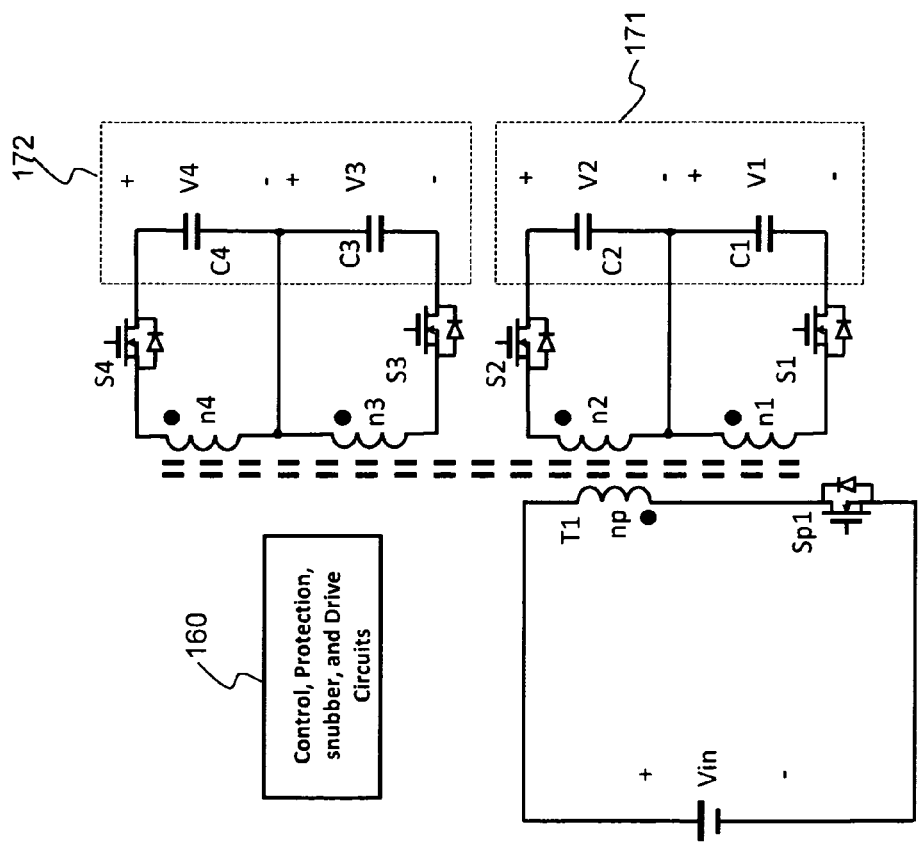
FIG. 13 illustrates an embodiment of a multi-output power converter in accordance with various embodiments of the present disclosure.

The power synthesizer needs multi voltage rails at the input. These voltage rails can be generated by multi-output power supplies. Such power supplies can be implemented with different topologies, such as flyback converters, forward converters, etc. FIG. 13 shows an arrangement with a flyback topology with 2 pairs of output voltages (171 and 172, more outputs can be added easily by repeating the pattern). If the relationship between the number of turns of the secondary windings has a doubling relationship:

$n2=2*n1, n3=2*n2, n4=2*n3$

Then ideally the output voltage will also have a doubling relationship:

$V2=2*V1, V3=2*V2, V4=2*V3$

By controlling of duty cycle of the primary switch Sp1, the output voltages can be regulated to the desired value. S1 through S4 in the secondary are synchronous rectifiers and can be replaced with diodes if desired. The output voltages can be easily arranged into asymmetric voltage pairs (171 and 172) to suit the needs of a power synthesizer.

Figure 14:
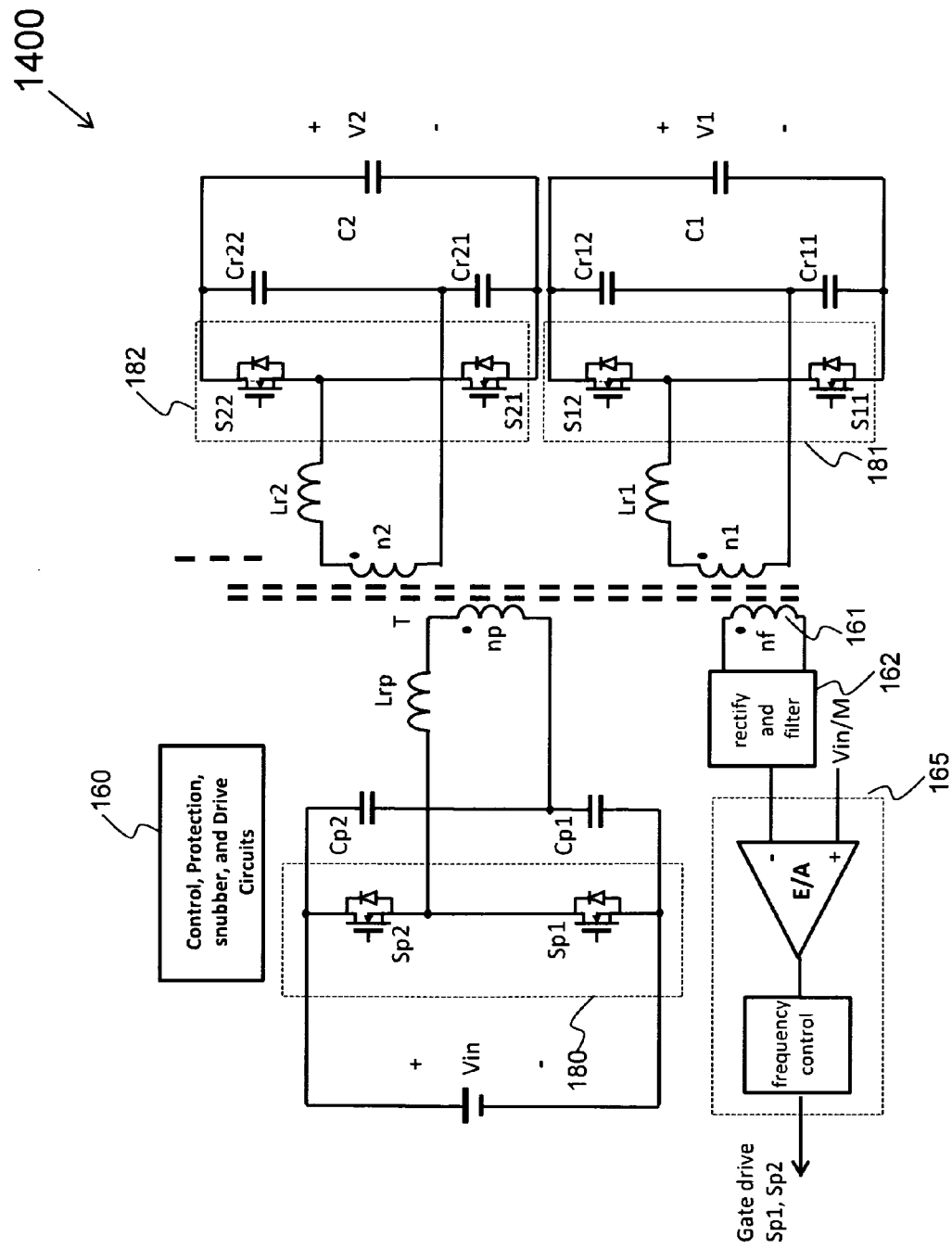
FIG. 14(a) illustrates an embodiment of a resonant power converter with automatic frequency tracking in accordance with various embodiments of the present disclosure.
FIG. 14(b) illustrates simulated waveforms of the resonant power converter in FIG. 14(a) in accordance with various embodiments of the present disclosure.
Figure 14B:
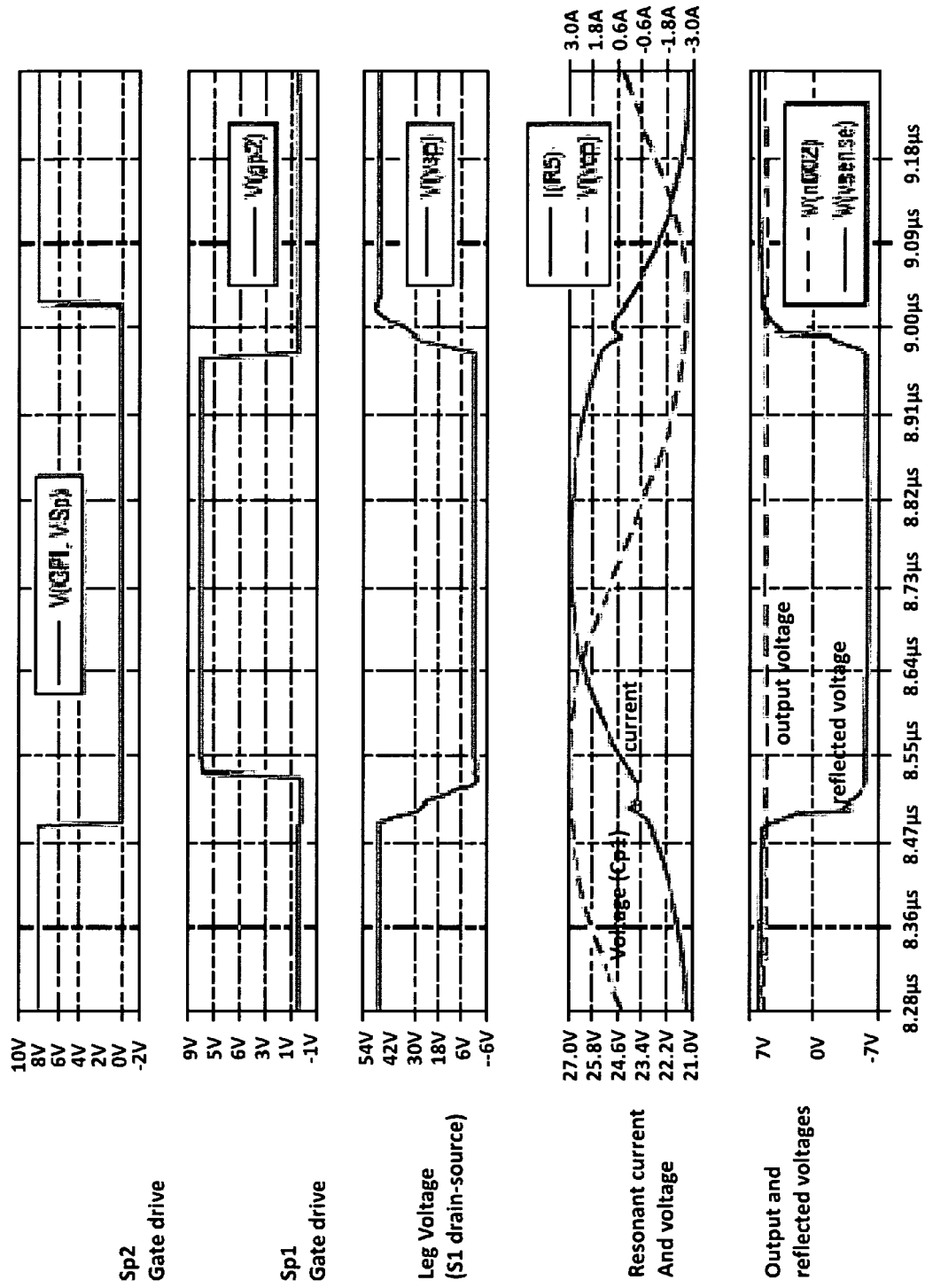

In some applications, the input voltage Vin may already be at the right value for the system, so the multi-output power supply just needs to convert the input voltage to needed multi-output format, and does not need to adjust values of its outputs. In this case the multi-output power supply behaves as a multi-output bus converter. FIG. 14(a) shows a multi-output resonant converter with local compensation suitable for such applications. Half-bridge configurations at the primary side (180) and at the secondary side (181 and 182) are shown in the figure. However, as well known in the industry, full-bridge and other suitable configurations, and any combination thereof, can also be used. Traditionally, a resonant converter such as an LLC converter has a resonant tank only at the primary side of the transformer. When such a topology is extended to multi-output configuration by adding more transformer windings, each output's voltage is affected by the leakage inductance of the secondary winding to which it is coupled. Therefore, the voltage of the each output may deviate significantly from the ideal value determined by the turns-ratio of the transformer windings, resulting in voltage inaccuracy. In the new topology of FIG. 14, each output also has a resonant tank coupled to the associated secondary winding, consisting of two resonant capacitors in half-bridge configuration (e.g. Cr11 and Cr12 for V1) and a resonant inductor (e.g. Lr1 for V1). This double-side resonance topology significantly reduces the effect of transformer leakage inductance on voltage regulation, and thus achieves better cross regulation between different outputs, and also allows the output voltage to be sensed at the primary side more accurately (from feedback winding 161, for example). The resonant inductors can be discrete parts, or the leakage inductance of the transformer windings, or any combination thereof. Series resonant tanks are shown in the figure, but other types of resonant tanks can also be used, including LLC (utilizing the magnetizing inductance of the transformer), LCC, parallel resonant, series-parallel resonant, multi-element resonant etc. However, the resonant tanks at the primary side and the secondary side should have the same configuration, and the components in the resonant tanks should have about the same equivalent values (considering the scaling factor of transformer's turns ratios). All the resonant tanks should be designed to have the same or approximately the same resonant frequency (or resonant frequencies if more than one resonant frequencies existing in a tank). If the converter's switching frequency is the same as the designed resonant frequency, and thus the leakage inductance (or any added inductance to the resonant tanks) is compensated by the associated resonant capacitors, and resonant tanks have a voltage gain of 1. Under this condition, the output voltages follow the exact relationship determined by the transformer winding turns-ratios, if the power losses of the components are ignored:

$$V2 = \frac{n2}{n1}V1,$$

where n2 and n1 are the number of turns of the secondary windings coupled to V2 and V1 respectively.

Even if the operation frequency is not exactly the same as the resonant frequency of each resonant tank due to component tolerance and other issues, the compensation effect of the resonant capacitors can still improve the performance of the power supply. The feedback winding 161 (with nf turns) picks up a reflected voltage whose amplitude is in proportion to the secondary winding voltages of the transformer. After processed by the signal conditioning block 162, the resulting feedback signal coupled to the error amplifier (E/A) is proportional to the output voltages. In one preferred embodiment, the functions performed by the block 162 include rectification and filtering, and possibly some signal conditioning to remove the effect of noise and irregularity caused by switching actions. By making the error/amplifier's reference voltage proportional to the input voltage with the right scaling factor M, all resonant tanks should have a theoretic voltage gain of close to one, so the effective voltage gain of the equivalent resonant tank representing the multi-tank system in this converter is approximately 1 in steady state. Considering the parameter tolerance in the resonant tanks, the reference, and the feedback control, the steady-state switching frequency may not be exactly the intended resonant frequency of the resonant tanks, or the same as the actual resonant frequency of any resonant tank. However, it will not deviate significantly from the intended resonant frequency if the component tolerance is not too high, for example not higher than +/−20%. This mode of operation is called controlled near resonance operation. As a result, the converter will automatically operate at a frequency very close to (for example within 10%) the resonant frequencies of all resonant tanks, achieving good efficiency and good output voltage regulation without sensing each output. Please note that in other embodiments this control scheme can work well also by sensing the output voltage directly at one of the outputs (instead of through a feedback winding), but such control system with direct sensing is more complex and expensive due to the need of signal isolation.

The existence of a closed-control loop in the controlled near resonance operation also allows the transient performance be controlled if necessary. Especially, for large transients such as startup or fault protection, a soft start or soft transition can be controlled through duty cycle or switching frequency of the converter, or through trajectory control of the resonant tank variables (the current in a resonant inductor, transformer winding or switch, the voltage across a resonant capacitor, or both).

FIG. 14(*b*) shows the simulated waveforms of the converter in FIG. 14(*a*) in steady state operation. The primary switches Sp1 and Sp2 are gated on and off in complementary mode, with each having about 50% duty cycle. A short transition period is added between a switch's turn-off and the other switch's turn-on, to avoid cross conduction and allow zero-voltage turn on. It can be seen that zero voltage turn-on has been achieved for both Sp1 and Sp2. However, in other embodiments the resonant converter can be operated to achieve zero-current turn-off of Sp1 and Sp2, as is well known in the industry. Usually, to achieve zero voltage turn-on the magnetizing inductance of the transformer T is intentionally reduced. It can been seen also that the amplitude of the reflected voltage from the feedback winding nf is very close to an output voltage with same number of turns as nf. The small difference is mainly due to the power losses in the output circuit. Such deviation can be reduced if desired by considering power loss related information such as the transformer or switch current in the feedback or reference circuit of the error amplifier denoted as E/A in the regulation circuit 165. Although synchronous rectifiers S1 through S4 are shown in the secondary in FIG. 14(*a*), diode rectifiers can also be used to replace any or all of the synchronous rectifiers, as usual in power converters. The gate drive signals of synchronous rectifiers can be obtained from control signal in the primary through a gate drive transformer or other isolation components, or from windings on the main power transformer T, or from the current signals in the associated secondary windings or from the currents in the devices themselves. More outputs can be obtained by adding more secondary windings and associated resonant tanks and rectifier circuits.

This topology can also be used to operate away from the resonant frequency and thus achieves different voltage gains to regulating the output voltages to desired values. As long as the equivalent LC values in each resonant tank (considering the scaling factor of the transformer's turns ratios) are approximately the same, the double side resonance can achieve good cross regulation between the outputs.

Figure 15A:
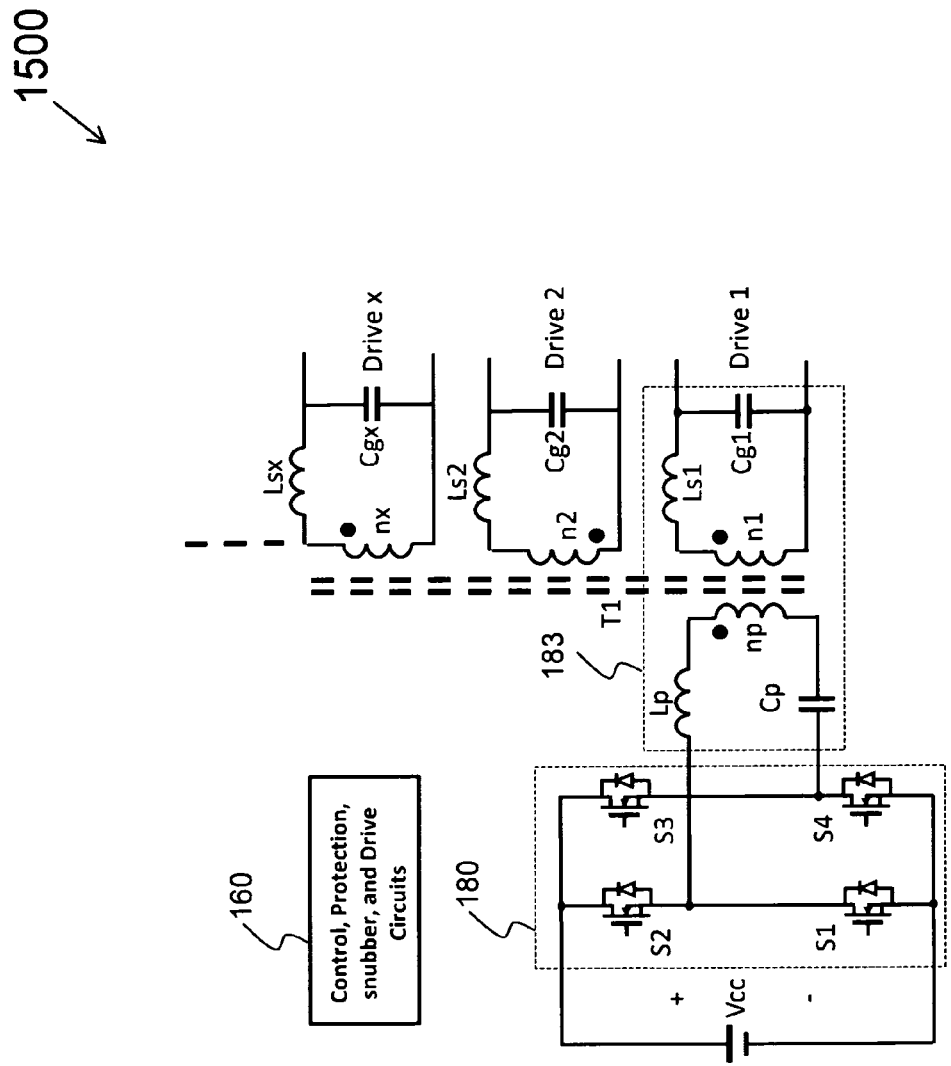
FIG. 15(a) illustrates an embodiment of a resonant gate drive in accordance with various embodiments of the present disclosure.
Figure 15B:
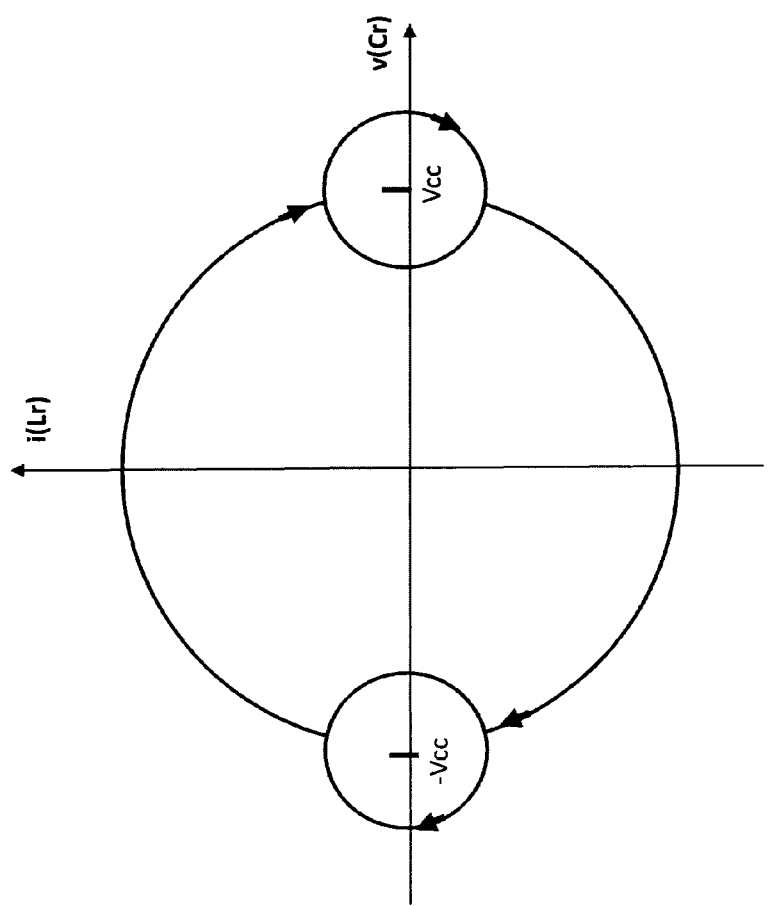
FIG. 15(b) illustrates the state-plane trajectory of the resonant gate drive in FIG. 15(a) in accordance with various embodiments of the present disclosure.
Figure 15C:
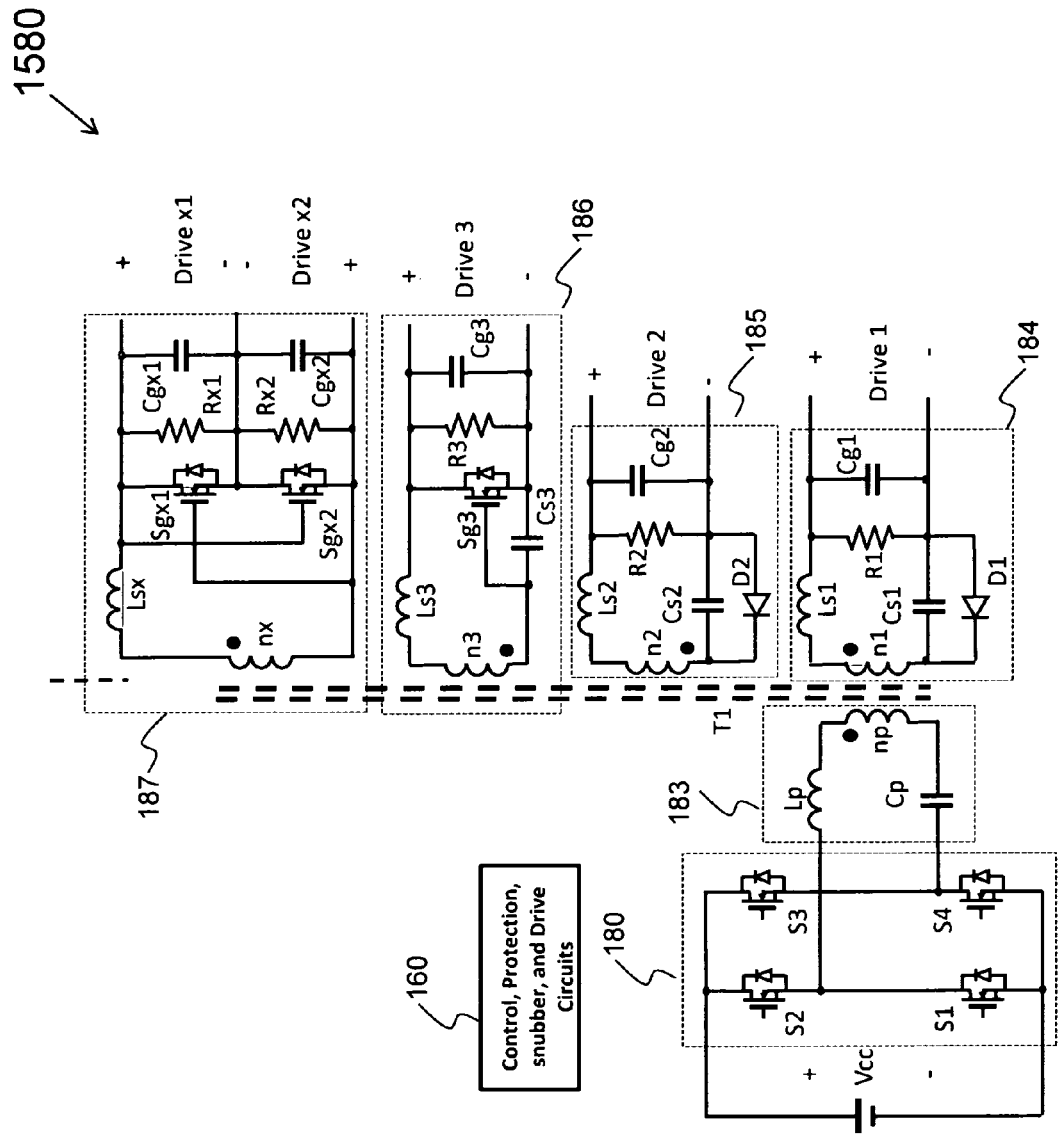
FIG. 15(c) illustrates an embodiment of a resonant gate drive with gate voltage shifting in accordance with various embodiments of the present disclosure.
Figure 15D:
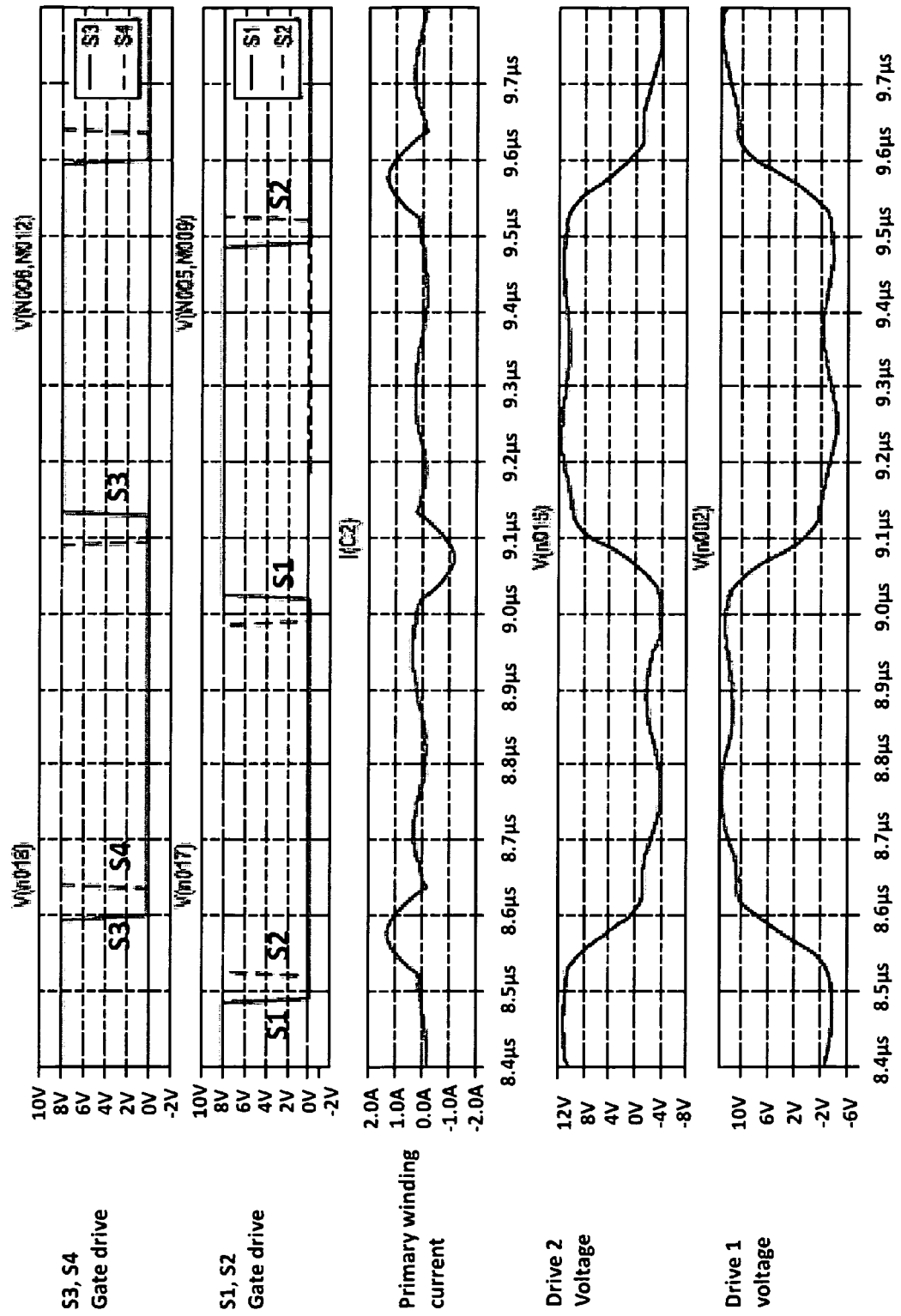
FIG. 15(d) illustrates simulated waveforms of the resonant gate drive in FIG. 15(c) in accordance with various embodiments of the present disclosure.

The main power switches (usually power MOSFETs) should be designed to have low gate charge, so the driving loss is not significant. This means that the gate threshold voltage of the switch and the drive voltage applied on the gate should be reduced whenever possible. If the switching frequency used is high, it may be desirable to use resonant gate drive technologies to further improve the power converter efficiency. For a converter running around resonant frequency, it's also possible to use similar timing and drive circuit of the primary power switches (in this example Sp1 and Sp2) to drive the synchronous rectifiers, making the converter design much easier. FIG. 15(*a*) shows an example of a resonant gate drive circuit. A bridge circuit consisting of drive switch Network 180 (S1 through S4) converts the control signal for a controller to an ac waveform. The ac waveform is fed into a resonant circuit coupled to a gate drive transformer T1. Cp in the primary winding of T1 can serve for dc-blocking, or be part of the resonant capacitance, or be used for both purposes. Lp, Ls1, Ls2, and Lsx are the resonant inductors, and each of them can be a discrete inductor, the leakage inductance of the corresponding transformer winding, or any combination thereof. Cg1, Cg2 and Cgx are the equivalent gate-source capacitance of the switches to be driven, or any additional capacitance put there, or any combination thereof. Cg1, Cg2, and Cgx are also part of the resonant capacitance. To make sure that each drive output has similar performance, it's important to make sure that each component associated with each drive winding of transformer (n1, n2, nx) has similar equivalent value to its counterpart in any other driver winding when transferred to the primary side. If different numbers of turns are used in the driving windings, then in any secondary winding circuit, the secondary inductance (Ls1, Ls2, and Lsx) should be approximately proportional to the square of the number of turns of the winding, while the capacitance should be approximately inversely proportional to the square of the number of turns of the winding. If the equivalent gate-source capacitance of any switch is different from another's, external capacitors of appropriate values can be used to make the equivalent capacitance reflected to the primary approximately the same for all drive windings. In this way, all the resonant components can be grouped into a series resonant tank of inductance Lr (including the leakage inductance of the transformer and any trace and packaging inductance) and resonant capacitance Cr. Traditionally, a resonant gate drive involves one resonant state in one direction (charging and discharging), so the gate voltage is basically sinusoidal. Issues with this kind of driving scheme is that it takes a relatively long time for a switch to change from OFF state to ON state or vice versa, and the gate drive waveform varies strongly with the variation of the inductance and capacitance values. As a result, the converter performance is compromised. To improve upon this, a new composite driving scheme can be used. FIG. 15(b) shows the concept of the composite driving technique in state plane. As is well known, a resonant tank's normalized inductor current i(Lr) and the normalized capacitance voltage moves in a circular fashion in a resonant state. With the composite driving technology, the resonant tank operates in more than one state in the charging phase and discharging phase of a switching cycle.

In FIG. 15(b) two states are shown for each direction. The first state is shown by the big arcs in the trajectory, during which the voltage applied to the resonant tank is zero, and the resonant voltage (and thus gate voltages) changes polarity, as the center of the arcs is (0, 0). This can be called the polarity reversing state. The other state is shown by the small circles, during which the drive power supply Vcc is applied to the resonant tank in positive or negative direction, so the centers of the circles are (+Vcc, 0) and (−Vcc, 0) respectively. Because the radius of the small circles is much smaller than Vcc, during second state the resonant voltage fluctuate around Vcc or −Vcc slightly, so roughly the gate voltage can be considered to be pseudo "clamped" around Vcc or −Vcc with a small ripple. This state can be called a pseudo clamped state. Because a trajectory can circle the center in second state (the pseudo clamp state) as many times as required, the gate drive voltage can stay in the pseudo "clamped" mode for a relatively long and controllable time which is terminated by the start of the polarity reversing state in the other direction.

A complete switching cycle can be divided into 4 phases. The following is an example for explanation:

Assuming at the start the drive circuit is in positive charging phase with S2 and S4 turned on (S1 and S3 are off), so the circuit is in positive pseudo clamp state. The drive outputs Drive 1 and Drive X have positive voltages around a maximum value determined by Vcc with a scaling factor associated with the winding turns ratios and the ratios of resonant capacitances. The switches coupled to Drive 1 and Drive X are turned on. The other drive output Drive 2 has a voltage around negative maximum, so the switch coupled to it is off. The drive circuit and the switches will be in this state until S2 is turned off and S1 is turned on.

After S2 is turned off and S1 is turned on, the drive circuit enters into negative polarity reversing state, and the resonant voltage and thus the gate voltages cross zero and reverse their polarities.

When the resonant capacitor voltage reaches close to −Vcc (or the current in Lr is about zero), S4 is turned off and S3 is turned on, now the drive circuit enters the negative pseudo clamp state, and the gate voltages are in pseudo clamped mode again, but the voltage polarities are versed compared to the starting point mentioned above. This state terminates until S1 is turned off and S2 is turned on.

After S1 is turned off and S2 is turned on, the resonant voltage and gate drive voltages start their journey to change polarity again in positive polarity reversing state.

When the resonant voltage V(Cr) reaches close to Vcc, S3 is turned off and S4 is turned on, the drive circuit enters into the positive pseudo "clamp" state, and the system finishes a full switching cycle.

By adjusting the relative duration of the pseudo clamp mode, the drive circuit's operation is more independent of the resonant tank parameters, and the transition time between a switch's states can be faster than in traditional control. Moreover, the duty cycle of the main switches can even be adjusted as the durations of pseudo clamp modes do not have to be equal in positive direction and negative direction. This gives better performance and freedom in the converter design. The key to this scheme is that the control timing of the drive switches S1 through S4 should be determined by comparing the resonant capacitor voltage to Vcc and −Vcc, or comparing the resonant inductor current to zero (or a small value), so this is basically a drive scheme with feedback. Please note that actual feedback signal, either the resonant capacitor voltage or the inductor current, doesn't have to be measured at the primary side of the transformer T1. As long as the proper scaling is considered (due to the transformer turns ratios and the LC component values), the feedback signal can be taken from one or more driving circuit on the secondary side of the transformer, or from one or two feedback windings on the transformer. Alternatively, the duration of the polarity reversing states can be fixed according to the resonant tank LC parameters (roughly half the resonant cycle). This is a simple open loop control, but should work reasonably well for many applications. Also, if more drives are needed, more driving windings and associated circuit can be added as this drive structure is easily expandable.

The above schemes are relatively easy to implement with modern analog and/or digital electronics. The above explanation is for steady state operation. During transients, such as during a startup, the control should be slightly modified. For example, during a startup, the switch frequency and/or duty cycle should be changed to reduce voltage and current stresses in both the drive circuit and the main power circuit. One possibility is to keep the duration of the polarity reversing state about the same as in steady state (without comparing the capacitor voltage), but gradually increase the duration of pseudo clamp states from zero to normal value in a soft-start process. Other control methods such as switching frequency control, duty cycle control, and trajectory control can also be used to limit the stress level. For fault protection, hick-up schemes with shutdown and soft-start phases can be considered.

The above circuit many have a draw back for some applications: a gate drive voltage swings to both positive and negative value symmetrically, and its dc component is zero. It may be desirable to move the gate drive voltage to more positive or more negative in certain applications, for purposes such as adjusting the dead-time between switches. FIG. 15 (c) shows an implementation with voltage shifting and voltage clamping techniques. Diodes D1 and D2 create a positive dc voltage for Drive 1 and Drive 2, so the voltage waveforms will be shifted up for both drive outputs. If a negative bias is desired in any output, the polarity of the associate diode can be reversed. The optional resistors R1 and R2 are used to discharge the gate voltages. By adjusting the values of Cs1 and Cg1, the waveform of Drive 1 voltage can be shifted up and down. Similarly, the voltage of Drive 2 can be shifted by the values of Cs2 and Cg2. The switch Sg3 clamps the negative voltage of Drive 3 to about zero. When the clamp switch is turned on, the resonant capacitor it clamps is shorted, and totally resonant capacitance of the resonant tank is changed. As a result, the voltage waveform may be changed. The capacitances of Cs3 and Cg3 and the number of turns of winding n3 can be optimized so the effect of this capacitance change is reduced. As an alternative, if needed another clamp switch can be put in parallel with Cs3, with its gate connected at the drain of Sg3. With the symmetric connection of these two switches, if Cs3 and Cg3 have the same capacitance, then the equivalent capacitance in the resonant tank doesn't see much change during the different phases of operation, and thus the gate voltage waveform is more consistent. Such a symmetric arrangement of clamp switches is shown with the circuit coupled to winding nx. The driving winding nx in this figure powers two drive outputs coupled together. These two outputs have reverse polarities, and can be used to drive for example two bottom switches in a bridge configuration or the power switches in a push-pull configuration. The optional clamp switches Sgx1 and Sgx2 can clamp the negative gate voltages to zero if needed. As the clamp switches is turned on alternatively, the resonance of this resonant tank is not affected much by the voltage clamp. More drive outputs can be added by repeating the circuit patterns in FIG. 15(*c*), and the voltage shifting and voltage clamping techniques shown in the figure can be used in any combination as needed.

FIG. 15(*d*) shows key simulated waveforms of the circuit shown in FIG. 15(*c*), and verifies the operation principles discussed above.

The above discussed gate drive technologies can be used to drive power switches and synchronous rectifiers in different topologies. The controller can take the feedback information of resonant capacitor voltage or transformer current to accomplish closed-loop driving, or use a configurable delay corresponding to the polarity reverse state to accomplish open loop driving.

Figure 16:
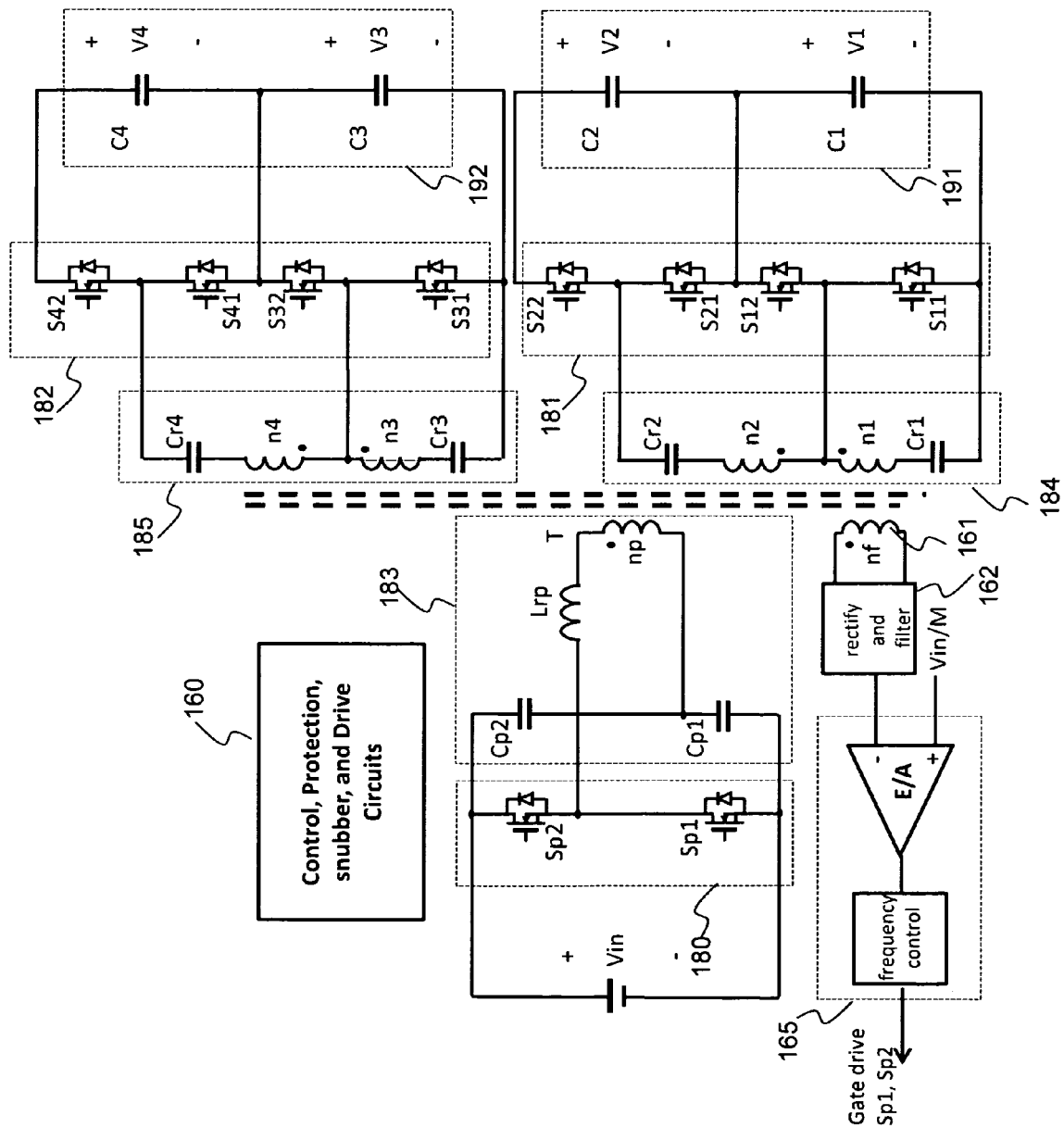
FIG. 16 illustrates an embodiment of a resonant power converter with outputs arranged in pairs in accordance with various embodiments of the present disclosure.

The topology in FIG. 14(*a*) uses one driving winding for each output voltage. To simplify the implementation, the output voltages may be combined into voltage pairs as needed by a power synthesizer. FIG. 16 shows a practical implementation. Now the resonant capacitors in the secondary side of the transformer Cr1, Cr2, cr3 and Cr4 are arranged to be in series with the secondary windings, and will resonate with the leakage inductance of their respective secondary windings. Since the leakage inductance of a secondary winding is proportional to the square of the number of turns of the winding, the resonant capacitance coupled to each winding should have a reciprocal relationship to the square of the number of turns of the winding so that all the resonant tanks can resonate at the same frequency, i.e.:

$$Cr2 \approx \frac{n1^2}{n2^2}Cr1; \; Cr3 \approx \frac{n2^2}{n3^2}Cr2; \; Cr4 \approx \frac{n3^2}{n4^2}Cr3;$$

If needed, discrete resonant inductors can be put in series with the transformer windings, and the value of resonant capacitors should be adjusted accordingly.

To simplify the transformer structure, the secondary windings in each voltage pair circuit is connected together: n2 is connected with n1, while n4 is connected with n3. Please note that the polarity of n2 is reverse to n1's polarity, and the polarity of n4 is reverse to n3's. This reverse arrangement of windings allows the rectifiers (synchronous rectifiers or diodes) to be connected together in a dual totem network 181 and 182, as is shown in FIG. 16. The outputs are arranged in asymmetric pairs 191 and 192. With this arrangement, when Sp1 conducts, synchronous rectifiers S11, S22, S31 and S42 should be gated on. When Sp2 conducts, synchronous rectifiers S12, S21, S32, and S41 should be gated on. Because now the top winding in a voltage pair circuit charges both output voltages in the pair, to maintain a doubling relationship between the output voltages in the pair, the top winding should have three times the number of turns as the bottom winding: n2=3*n1, n3=4*n1, n4=3*n3.

The doubling relationship of output voltages can also be realized with simpler winding structure by duty cycle control. In the half-bridge topology shown in FIG. 17(*a*), multiple windings are coupled to the same magnetic component (transformer T1 in this case), where there exists a relationship between the numbers of turns in the windings: n3=4*n2. Sp1 and Sp2 are controlled in complementary mode but with different duty cycles. The duty cycle of Sp1, D1, is twice the duty cycle of Sp2, D2: D1=2*D2. If the short transition periods in which both switches are off are ignored, then we have: D1≈⅔ and D2≈⅓. Then by virtue of volts-second balance of the magnetic component T1, the output voltages in steady state have a doubling relationship:

$$V1 = Vin * \frac{n2}{3*n1}; \; V2 = 2*V1; \; V3 = 4*V1, \; V4 = 8*V1$$

In this way, one secondary winding is used to produce a pair of outputs. In one embodiment, the two output voltages are different in a pair. In other embodiments the two voltages can be made to have a different relationship by adjusting D1 and D2 differently. The synchronous rectifiers S1 through S4 can be replaced by diodes if needed. The gate drive signals for the synchronous rectifiers can be in synch with the primary switches, or emulate ideal diodes: gated on when the body diode starts conducting, and gated off when the current through it is lower than a threshold value. The drive signals can be obtained from primary control signal or through transformer windings of T1, or through current signals in the transformer windings or the switches. As an option, the above discussed composite resonant driving technology can also be used, as the durations of the pseudo clamp state can be set to different values during Sp1 conducting phase and Sp2 conducting phases.

In practice, closed-loop control may be required to maintain the voltage relationship. A possibility is to use voltages in the primary side, such as capacitor voltages or a winding voltage to simplify the control cost. For example, when the voltage of Cp1 is less than 50% of the voltage across Cp2 (or less than ⅓ of the dc-link voltage across the half-bridge configuration of Sp1 and Sp2), then the duty cycle of Sp1 (D1) should be adjusted lower. When the voltage of Cp1 is higher than 50% of the voltage across Cp2, then the duty cycle of Sp1 (D1) should be adjusted higher. A feedback controller can automatically adjust the duty cycle to the right value.

Figure 17A:
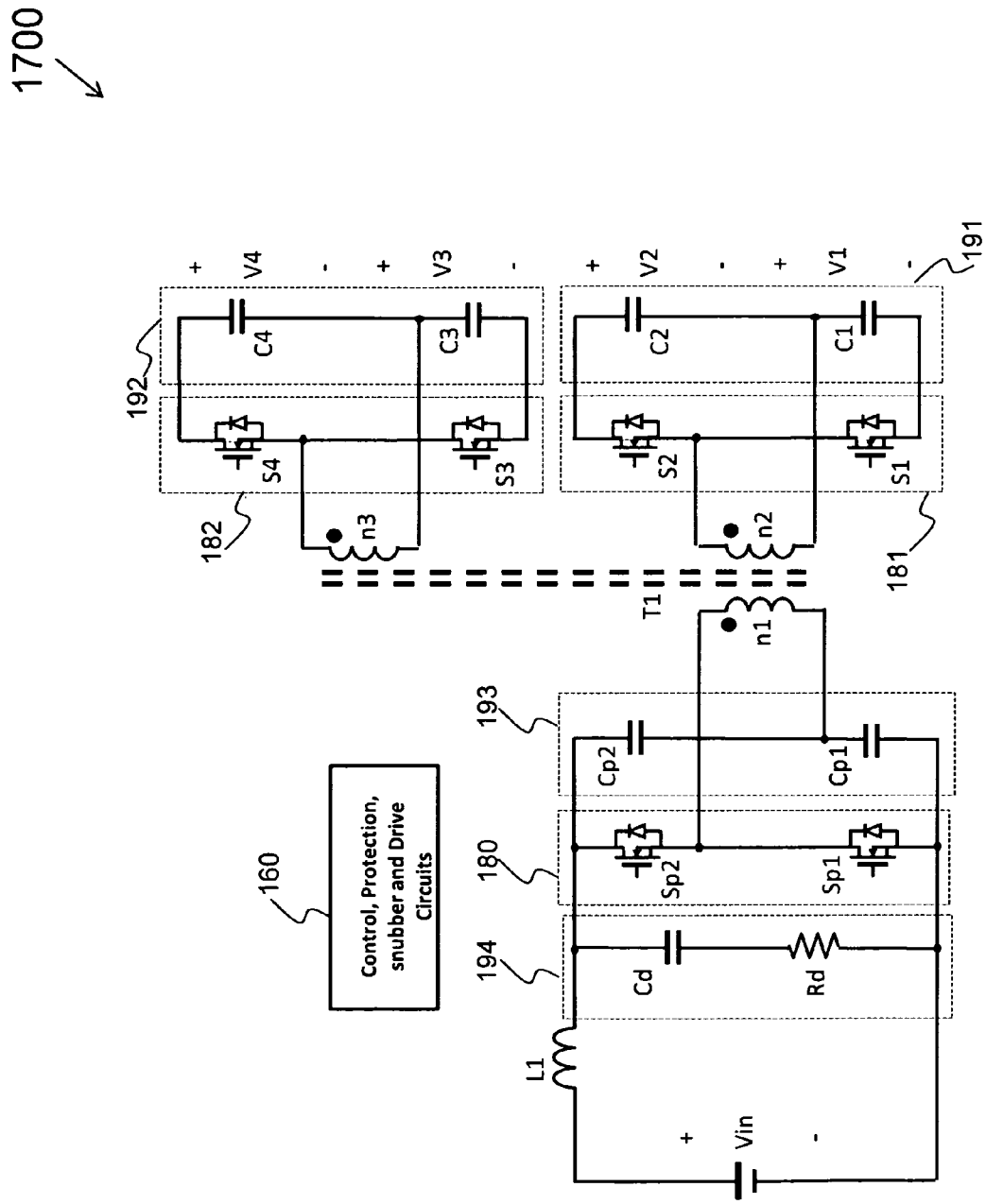
FIG. 17(a) illustrates an embodiment of a current-fed power converter in accordance with various embodiments of the present disclosure.
Figure 17B:
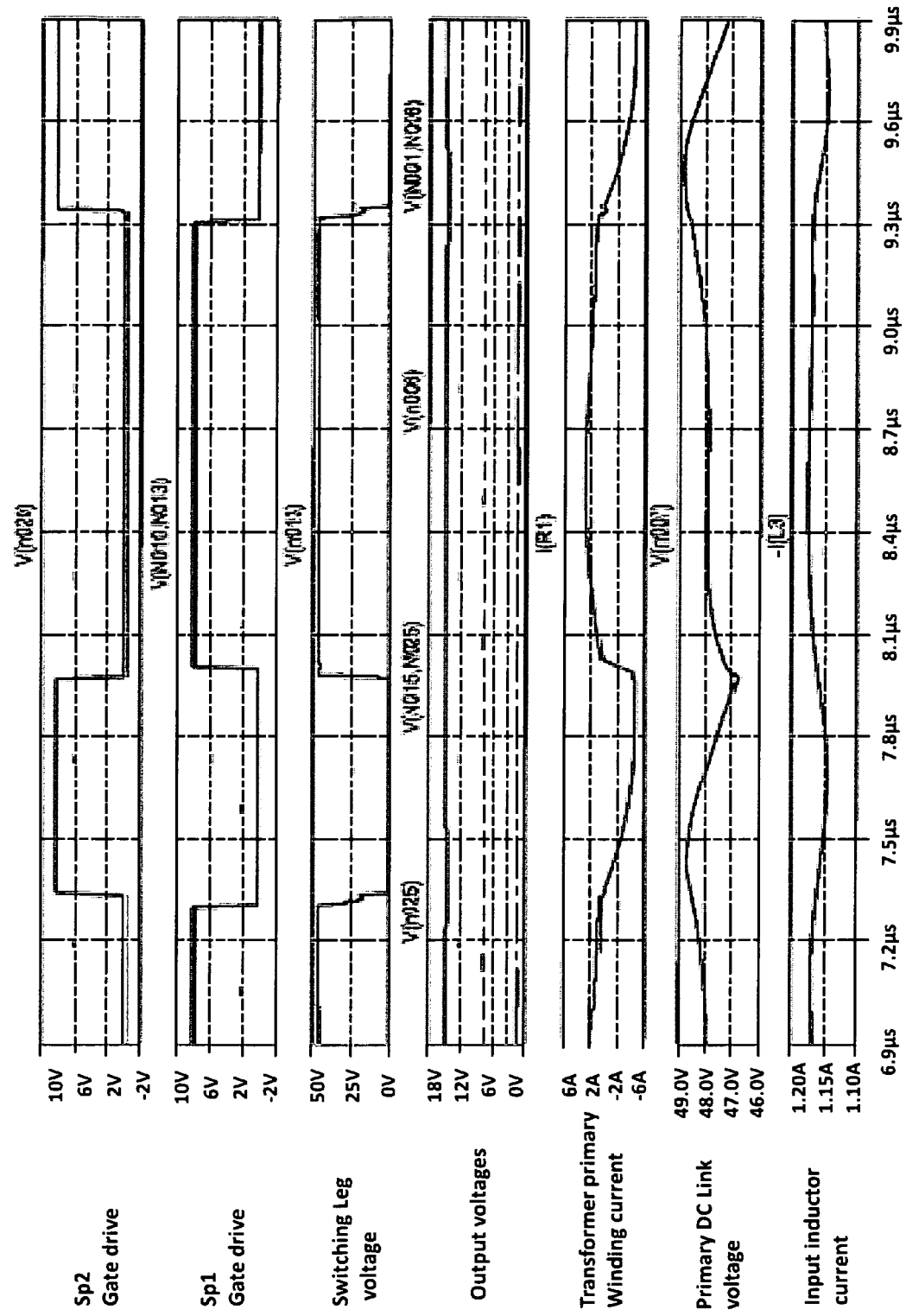
FIG. 17(b) illustrates simulated waveforms of the power converter in FIG. 17(a) in accordance with various embodiments of the present disclosure.

Due to current-fed nature of this topology caused by the input inductor L1, a snubber circuit or clamp circuit may be used to reduce the voltage stress of primary switches. In FIG. 17(*a*) an optional passive snubber consisting of Cd and Rd is inserted across the dc link and between the input inductor L1 and the switches. Other types of snubber or clamp circuits can also be used. FIG. 17(*b*) shows simulated waveforms of this topology. It can be seen that Sp1 is turned on with reduced voltage, and Sp2 is turned on with zero voltage. The ability to achieve soft-switching in this topology improves its efficiency.

Figure 18:
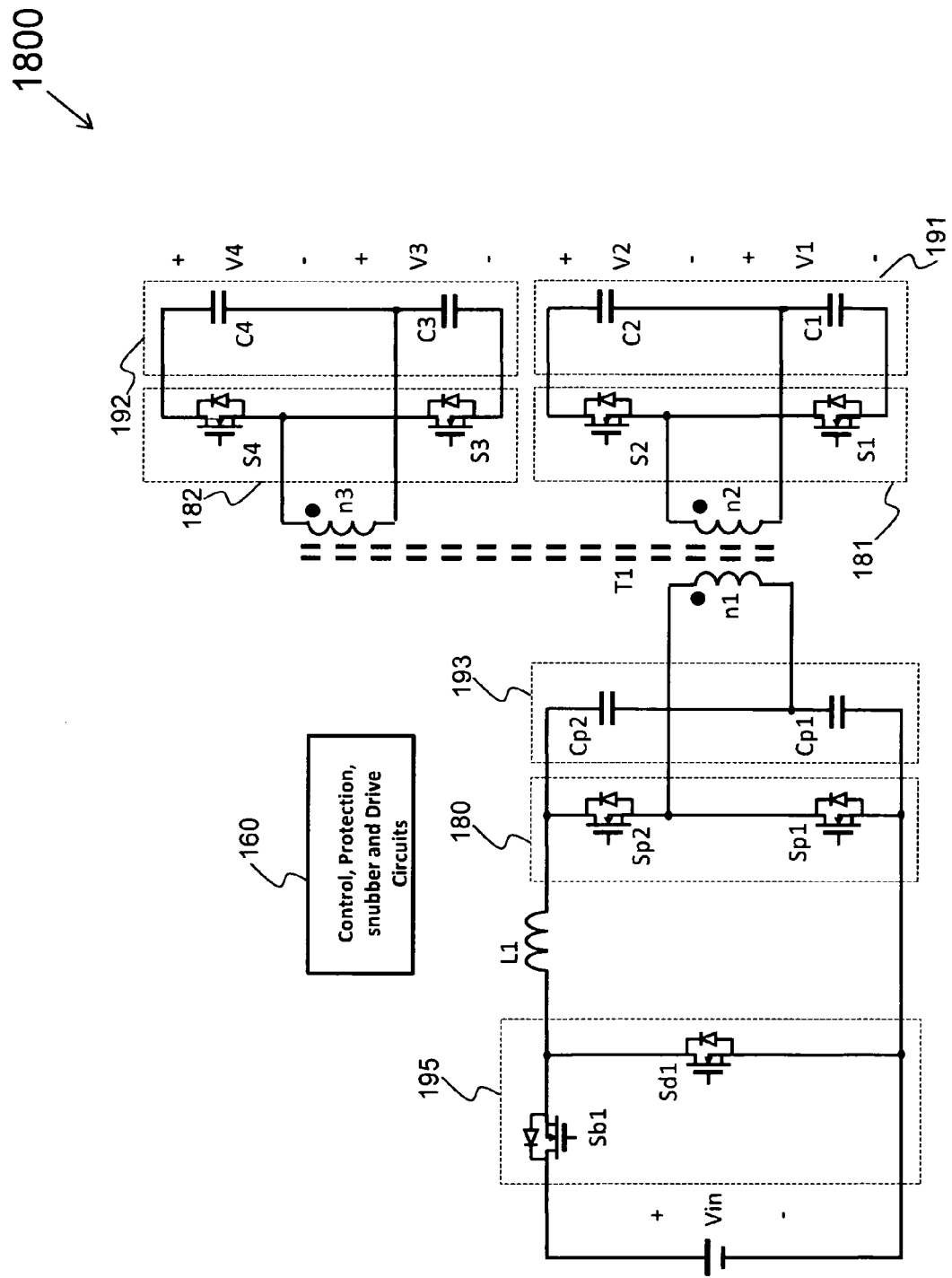
FIG. 18 illustrates an embodiment of a multi-output power supply with voltage regulation in accordance with various embodiments of the present disclosure.

The topology in FIG. 17(*a*) has limited ability to adjust the output values by adjusting the duty cycles of the switches. If a wide range of adjustment is needed, a regulation stage can be added at the input. FIG. 18 shows a buck regulation stage 195 consisting of buck switch Sb1 and synchronous rectifier Sd1 is added. The switching of Sb1 can be synchronized with Sp1 and Sp2, or can be arranged independently.

Figure 19:
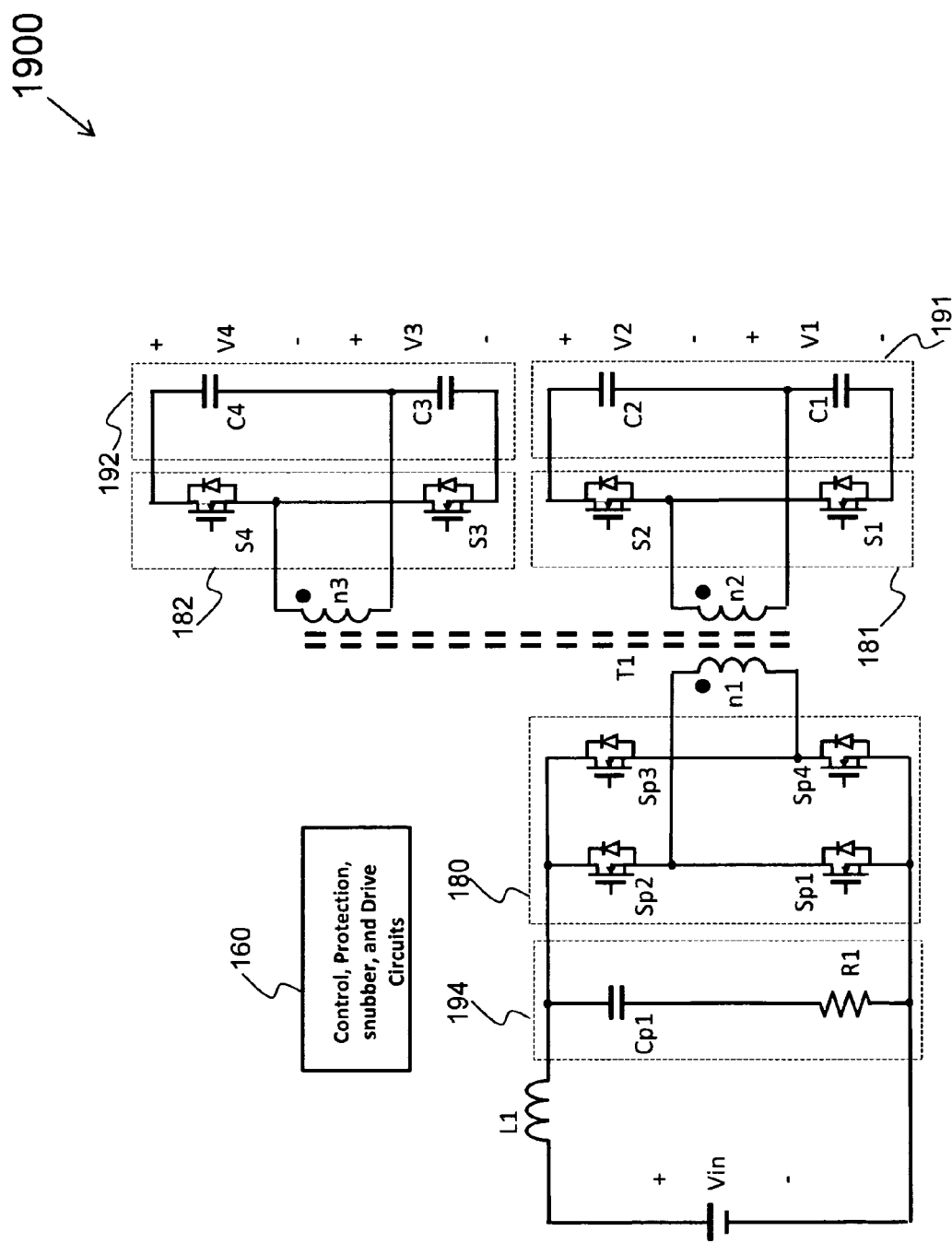
FIG. 19 illustrates an embodiment of a multi-output current-fed full bridge power converter in accordance with various embodiments of the present disclosure.

Different implementations can be obtained by changing the half-bridge configuration in FIG. 17(*a*) to different topologies. A full-bridge configuration using the same duty cycle control principle is shown in FIG. 19 which can have two pairs of outputs. The secondary windings also have a quadruple relationship between the number of turns: n3=4*n2.

The primary switch network consisting of four primary switches Sp1 through Sp4 are operated in 3 states alternatively:

- State 1: Sp1 and Sp3 are turned on, and Sp2 and Sp4 are turned off. Secondary side synchronous rectifiers S1 and S3 conducts, and S2 and S4 are gated off. The transformer winding voltages are determined by V1 and V3;
- State 2: Sp1 and Sp3 are turned off, and Sp2 and Sp4 are turned on. Secondary side synchronous rectifiers S1 and S3 are gated off, and S2 and S4 are gated on. The transformer winding voltages are determined by V2 and V4;
- State 3: all primary switches Sp1 through Sp4 are turned on (or at least switches in one of the two legs, i.e. Sp1 and Sp2 or Sp3 and Sp4, are turned on), all secondary synchronous rectifiers S1 through S4 are gated off. The transformer winding voltages are zero.

In a switching cycle these states may have different sequences, but a preferred sequence is that an active state (State 1 or State 2) is followed by a zero state (State 3), and then the other active state (State 2 or State 1), and then a zero state (State 3). The duty cycle of State 1 (D1), should be kept at twice the duty cycle of State 2 (D2): D1=2*D2. The remaining duty cycle D3=1−D1−D2 is the duty cycle of zero state S3, and should be split into two parts to be inserted between D1 and D2. In steady state, the ideal output voltages are:

$$V1 = \frac{Vin}{2D1}\frac{n2}{n1}, V2 = 2V1, V3 = 4V1, V4 = 8V1$$

Therefore, by controlling D1, the output voltages can be adjusted to the desired value. This control can be implemented as a current mode or voltage mode closed-loop control if precise regulation is required.

To maintain the doubling relationship between V2 and V1, another closed-loop control may be used to adjust the relative value of V2. If V2 is higher than the ideal value (2*V1), D2 should be increased. If V2 is lower than the ideal value, D2 should be reduced.

If the duty cycle of State 3 (zero state) is intentionally kept close to zero, then this converter becomes a multi-output bus converter, which may have high efficiency.

Because the primary side switches are not clamped, there may be high voltage stress during a switch's turn-off. Proper measures, such as a snubber or an active clamp circuit can be used to reduce the voltage stress. In FIG. 19, a snubber/clamp circuit 194 is shown. In a preferred embodiment, the circuit 194 may be a passive snubber consisting of a capacitor and a resistor. In another embodiment, the circuit 194 may have one or more active clamps.

Figure 20:
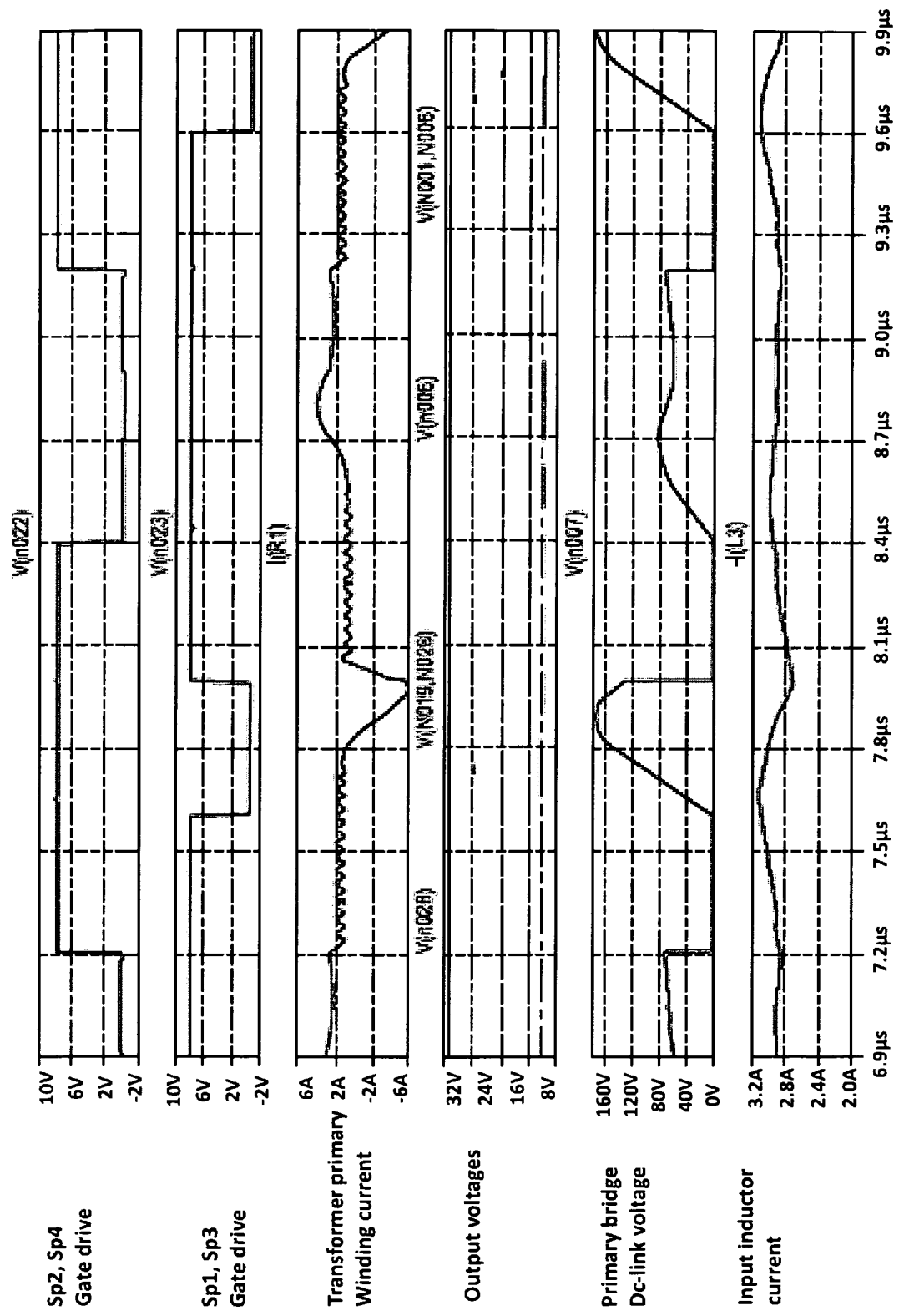
FIG. 20 illustrates simulated waveforms of the power converter in FIG. 19 in accordance with various embodiments of the present disclosure.

FIG. 20 shows the simulated key waveforms of the converter shown in FIG. 19 in an example implementation, and verifies the operation principle discussed above. Although doubling relationship is shown in this embodiment for the voltages in a pair, other relationships are possible by changing the relationship between D1 and D2. If D1=D2, then the two voltages in pair 191 or 192 will be equal.

Figure 21A:
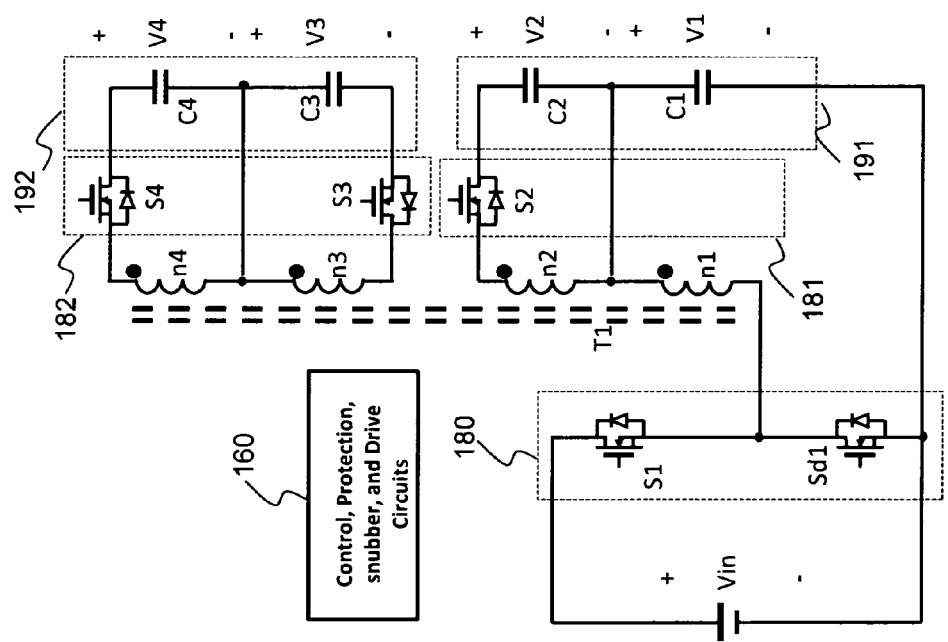
FIGS. 21(a) and 21(b) illustrate embodiments of a multi-output power converter based on a buck topology in accordance with various embodiments of the present disclosure.
Figure 21B:
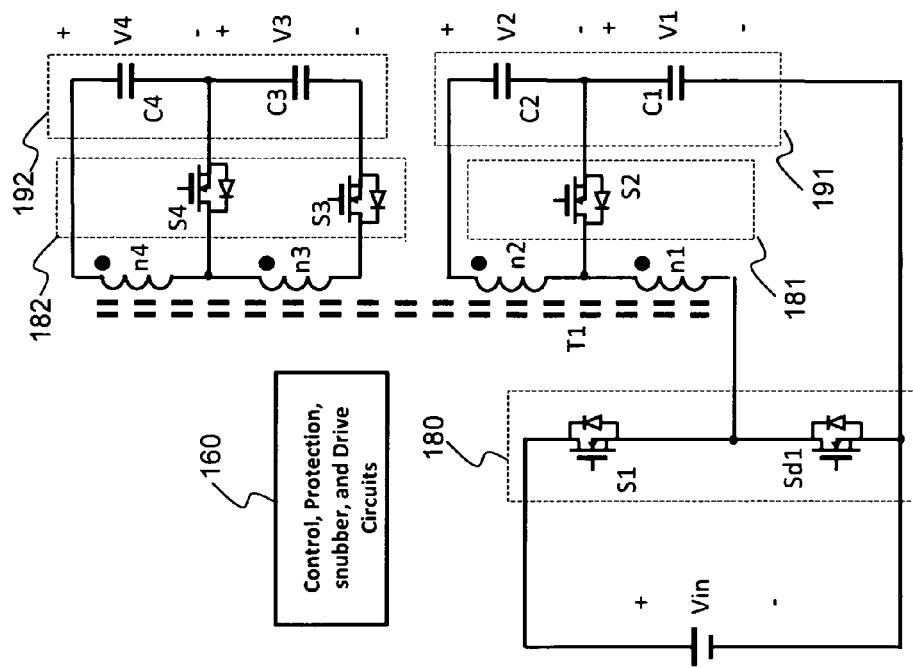

In some power applications such as smart phones and other mobile devices, there is no isolation needed between the input and the outputs of the power supply. Then a buck converter based multi-output configuration, with similar principles as discussed before, can be used to generate the input voltages for the power synthesizer. FIG. 21 shows two more examples. In FIG. 21(a), flyback windings n2, n3 and n4 are added to the magnetic component (inductor T1), and S2 through S4 work as synchronous rectifiers (in rectifier networks 181 and 182). When S1 conducts (S1d is gated off) in the buck switch network 180, switches in the rectifier networks 181 and 182 (S2 through S4) are gated off. When Sd1 conducts (S1 is turned off) in the freewheeling mode of the buck converter, S2 through S4 are gated on so power is transferred from V1 to V2 through V4, and the relationship between the output voltages is determined by the turns-ratios of the windings. The circuit in FIG. 21(b) works similarly to the circuit in FIG. 21(a), but the rectifier networks 182 and 181 are arranged slightly differently.

Figure 22:
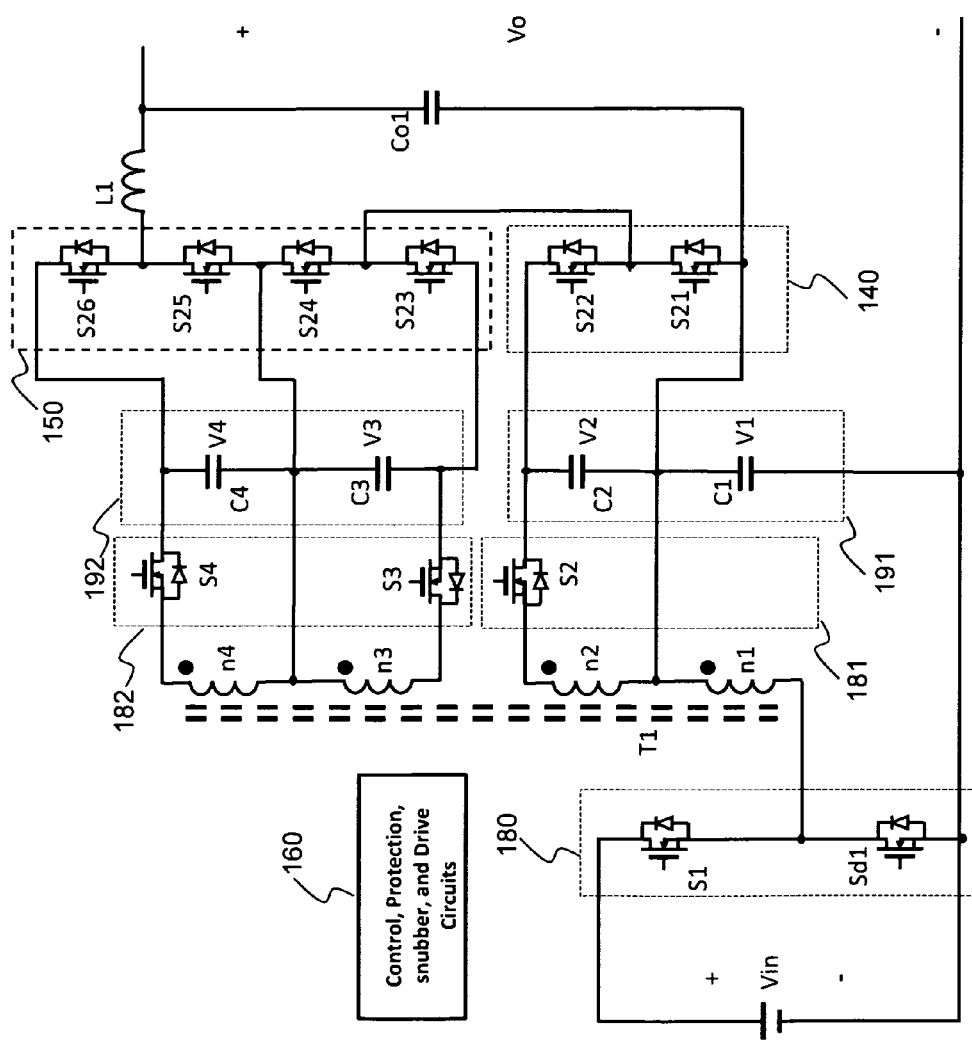
FIG. 22 illustrates an embodiment of a dynamic power supply based on a buck topology in accordance with various embodiments of the present disclosure.

The power synthesizer described above has a minimum voltage of zero. If the power amplifier needs a higher minimum voltage, another voltage source can be added to the power synthesizer. FIG. 22 shows an example of a fast dynamic power supply based on a buck-based topology. V1 is the minimum voltage applied to the PA and is generated by the buck switch cell 180 directly. Through using windings n2, n3 and n4 with proper number of turns, V2, V3 and V4 can have the correct voltages, and are fed into an eight-level power synthesizer consisting of a two-level cell 140 and 1 four-level cell 150. With this arrangement, eight different voltage levels can be achieved.

Please note that in all the above descriptions, the input power source Vin can be a primary power supply such as a battery pack, a battery plant, a photovoltaic cell, a fuel cell, or the output of a power converter such as a dc-dc converter, or an ac-dc converter. When a dc-dc converter or an ac-dc converter is used, the input voltage Vin can be dynamically adjusted. The input voltages to the power synthesizer (V1, V2, and so on) can be adjusted dynamically through changing Vin or controlling the switches in the multi-output power supply to optimize the performance (such as the efficiency) of the whole system. For example, when the system transfer power is increased due to heavier usage of users in a base station, the voltages can be increased. When the needed transfer power is reduced, the voltages can be decreased accordingly. For ET systems, the output voltages of the power supply can be controlled with a relatively slow voltage control loop (compared to the frequency of power synthesizer, or the envelope spectrum of the signal processed by the power amplifier) and follow the envelope peaks which are related to the peak or average power of the power amplifier's output over a duration of time, and change relatively slowly. Such a system is sometimes called average mode ET control.

Please note also that although in this disclosure multi outputs are used to describe the power supply topologies and control schemes, the concepts and principles can also be used for single output converters with straightforward modification (such as remove unused secondary windings and their associated circuitry). Of course, single-output power supply may not need the double-side resonance technique if the output voltage is sensed directly at the output. However, sensing the output voltage through a feedback winding at the primary side can still work well with double-side resonance technique even for the single-output applications, and using the feedback control to automatically operate a resonant converter at or near its resonant frequency is still a very effective technique for single-output converters.

Because the dynamic power supply has high bandwidth, the power synthesizer needs to work at very high frequency. Power integration techniques can be used to improve efficiency and reduce noise whenever possible. The switches are arranged in totem pole configurations in the synthesizer. In one embodiment, the two switches and their drive circuit in a totem pole are integrated together in a single die or a single package. In another embodiment, the four switches in a basic four-level cell and their drive circuits are integrated in a single die or package. In other embodiments, all switches of a power synthesizer and their gate drive circuit are better to be integrated into a single die, or into a single package. The control circuit of the synthesizer can be integrated too. It's preferable to include some bypass capacitors, such as C2, C3 and C4 in FIG. 21 in the same package or the same die as the switches. If possible, the power supply switches (for example S1 through S4 and S1d in FIG. 21) can also be integrated into the same die or the same package. The drive circuit and control circuit of the multi-output power supply can be also integrated into the die or the package. In an embodiment, the active components and key passive components of the whole dynamic power supply can be integrated into a package, with one or more semiconductor dies and optional discrete passive components. Finally, the power amplifier itself can be integrated with the power solution in a single die, or in a multi-chip module package. In this way, the effect of package parasitics can be minimized, and optimum performance can be achieved.

The above discussion of the advanced power solutions is made mainly in the context of power amplifier applications, since power amplifiers are a very suitable target for high performance power technologies. However, the applications of the power technologies discussed are not limited to power amplifiers, and can be used in any other applications, devices and equipment which require high efficiency power conversion and power control. The power technologies can be used in stand-alone power devices, power chips, power modules and power supplies systems, or be used in devices or systems with power solutions as a built-in function.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
a switch network having a plurality of switch cells connected in series, wherein each switch cell has a plurality of input voltages and a plurality of switches, wherein each switch is coupled to an input voltage, and wherein a first input voltage coupled to a first switch has a different value from a second input voltage coupled to a second switch;
an output voltage at an output voltage port with an output capacitor; and
an impedance network coupled between the switch network and an output voltage port, wherein the output voltage is configured to be a combination of the input voltages of the switch network in the form of: $Vo=\Sigma_1^N Ki \times Vi$, wherein Vo is the output voltage, N is the number of input voltages, Vi is the ith input voltage, and Ki is an integer equal to 0 or 1 depending on the ON/OFF status of the switches in the switch network.

2. The device of claim 1, wherein the switch network has a 2-switch cell which comprises 2 switches arranged in totem pole and is coupled to an input voltage.

3. The device of claim 1, wherein the switch network has a 4-switch cell which comprises 4 switches arranged in two pairs and coupled to two input voltages V1 and V2, wherein each pair has 2 switches and is coupled to an input voltage, and wherein V1 has a different value from V2.

4. The device of claim 3, wherein the input voltages have a substantially doubling relationship: V2=2V1.

5. The device of claim 1, wherein a plurality of gate drive signals of the switches are controlled by a decoding process.

6. The device of claim 1, wherein the impedance network has an inductor.

7. The device of claim 6, wherein the inductor comprises a parasitic inductance of a current path between a plurality of the switches in the switch cells and the output voltage port.

8. The device of claim 6, wherein the inductor and the output capacitor are part of a resonant tank having a quality factor close to 1.

9. The device of claim 1, wherein the switch network is configured such that an N1-switch cell and an N2-switch cell are in series, and the switch network is capable of producing N1×N2 voltage levels at the output voltage port, where N1 and N2 are positive integers representing the number of switches in the switch cells correspondingly.

10. The device of claim 1, wherein the switch network comprises a first switch cell and a second switch cell, wherein an input voltage in the first switch cell is twice the value of an input voltage in the second switch cell.

11. The device of claim 1, wherein a switch cell is integrated into a single package.

12. The device of claim 1, wherein the switch network is integrated into a single package.

13. The device of claim 1, wherein the device is integrated into a single package.

14. The device of claim 1, wherein the device is integrated with a power amplifier in a single package.

* * * * *